United States Patent
So et al.

(10) Patent No.: US 10,749,058 B2
(45) Date of Patent: Aug. 18, 2020

(54) MONODISPERSE, IR-ABSORBING NANOPARTICLES AND RELATED METHODS AND DEVICES

(71) Applicants: University of Florida Research Foundation, Gainesville, FL (US); Nanoholdings, LLC, Rowayton, CT (US)

(72) Inventors: Franky So, Cary, NC (US); Do Young Kim, Jenks, OK (US); Jae Woong Lee, Raleigh, NC (US); Bhabendra K. Pradhan, Marietta, GA (US)

(73) Assignees: University of Florida Research Foundation, Incorporated, Gainesville, FL (US); Nanoholdings, LLC, Rowayton, CT (US)

(*) Notice: Subject to any disclaimer, the term of this patent is extended or adjusted under 35 U.S.C. 154(b) by 0 days.

(21) Appl. No.: 15/735,303

(22) PCT Filed: Jun. 10, 2016

(86) PCT No.: PCT/US2016/037056
§ 371 (c)(1),
(2) Date: Dec. 11, 2017

(87) PCT Pub. No.: WO2017/039774
PCT Pub. Date: Mar. 9, 2017

(65) Prior Publication Data
US 2019/0006541 A1     Jan. 3, 2019

Related U.S. Application Data

(60) Provisional application No. 62/174,015, filed on Jun. 11, 2015.

(51) Int. Cl.
*H01L 31/0384*     (2006.01)
*H01L 31/055*     (2014.01)
(Continued)

(52) U.S. Cl.
CPC ........ *H01L 31/0384* (2013.01); *C01B 19/007* (2013.01); *C30B 7/14* (2013.01);
(Continued)

(58) Field of Classification Search
None
See application file for complete search history.

(56) References Cited

U.S. PATENT DOCUMENTS

| 4,614,958 | A | 9/1986 | Mikami et al. |
| 4,679,063 | A | 7/1987 | White |

(Continued)

FOREIGN PATENT DOCUMENTS

| CN | 1532959 A | 9/2004 |
| CN | 1637628 A | 7/2005 |

(Continued)

OTHER PUBLICATIONS

Extended European Search Report dated Jul. 19, 2016 in connection with Application No. EP 10833930.0.

(Continued)

*Primary Examiner* — Whitney Moore
(74) *Attorney, Agent, or Firm* — Wolf, Greenfield & Sacks, P.C.

(57) ABSTRACT

Embodiments described herein generally relate to monodisperse nanoparticles that are capable of absorbing infrared radiation and generating charge carriers. In some cases, at least a portion of the nanoparticles are nanocrystals. In certain embodiments, the monodisperse, IR-absorbing nanocrystals are formed according to a method comprising a nanocrystal formation step comprising adding a first precursor solution comprising a first element of the nanocrystal to a second precursor solution comprising a second element of the nanocrystal to form a first mixed precursor solution, where the molar ratio of the first element to the (Continued)

second element in the first mixed precursor solution is above a nucleation threshold. The method may further comprise a nanocrystal growth step comprising adding the first precursor solution to the first mixed precursor solution to form a second mixed precursor solution, where the molar ratio of the first element to the second element in the second mixed precursor solution is below the nucleation threshold.

13 Claims, 19 Drawing Sheets

(51) Int. Cl.
H01L 51/42 (2006.01)
C01B 19/00 (2006.01)
C30B 7/14 (2006.01)
C30B 29/46 (2006.01)
H01L 27/28 (2006.01)
H01L 31/032 (2006.01)
H01L 31/072 (2012.01)
H01L 31/0256 (2006.01)

(52) U.S. Cl.
CPC ............ C30B 29/46 (2013.01); H01L 27/286 (2013.01); H01L 27/288 (2013.01); H01L 31/0324 (2013.01); H01L 31/055 (2013.01); H01L 31/072 (2013.01); H01L 51/426 (2013.01); H01L 51/4273 (2013.01); H01L 51/4293 (2013.01); C01P 2002/82 (2013.01); C01P 2004/04 (2013.01); C01P 2004/64 (2013.01); H01L 2031/0344 (2013.01); Y02E 10/52 (2013.01)

(56) References Cited

U.S. PATENT DOCUMENTS

| | | | |
|---|---|---|---|
| 4,755,674 A | 7/1988 | Schaaf | |
| 4,778,692 A | 10/1988 | Ishihara et al. | |
| 4,885,211 A | 12/1989 | Tang et al. | |
| 5,121,398 A | 6/1992 | Rao | |
| 5,122,905 A | 6/1992 | Wheatley et al. | |
| 5,270,092 A | 12/1993 | Griffith et al. | |
| 5,315,129 A | 5/1994 | Forrest et al. | |
| 5,336,578 A | 8/1994 | Nukada et al. | |
| 5,389,788 A | 2/1995 | Grinberg et al. | |
| 5,438,198 A | 8/1995 | Ebitani et al. | |
| 5,619,039 A | 4/1997 | Montanari | |
| 5,710,428 A | 1/1998 | Ko | |
| 5,811,834 A | 9/1998 | Tamano et al. | |
| 5,965,875 A | 10/1999 | Merrill | |
| 6,140,646 A | 10/2000 | Busta et al. | |
| 6,337,492 B1 | 1/2002 | Jones et al. | |
| 6,509,574 B2 | 1/2003 | Yuan et al. | |
| 6,579,629 B1 | 6/2003 | Raychaudhuri et al. | |
| 6,734,452 B2 | 5/2004 | Gunapala et al. | |
| 6,777,961 B2 | 8/2004 | Hamamoto et al. | |
| 6,906,326 B2 | 6/2005 | Koch et al. | |
| 6,914,315 B2 | 7/2005 | Lai et al. | |
| 6,972,431 B2 | 12/2005 | Forrest et al. | |
| 7,247,850 B2 | 7/2007 | Laou et al. | |
| 7,270,586 B2 | 9/2007 | Tokailin et al. | |
| 7,279,705 B2 | 10/2007 | Iou | |
| 7,300,731 B2 | 11/2007 | Wang | |
| 7,381,953 B1 | 6/2008 | Kaufman | |
| 8,304,728 B2 | 11/2012 | So | |
| 8,405,028 B2 | 3/2013 | So | |
| 8,441,187 B2 | 5/2013 | Hunze et al. | |
| 8,507,865 B2 | 8/2013 | Boberl et al. | |
| 8,592,801 B2 | 11/2013 | So et al. | |
| 8,716,701 B2 | 5/2014 | So et al. | |
| 8,796,699 B2 | 8/2014 | So et al. | |
| 8,829,498 B2 | 9/2014 | So et al. | |
| 9,006,752 B2 | 4/2015 | So et al. | |
| 9,054,262 B2 | 6/2015 | Lewis et al. | |
| 9,214,502 B2 | 12/2015 | So et al. | |
| 9,276,048 B2 | 3/2016 | So | |
| 9,496,661 B2 | 11/2016 | Purdy et al. | |
| 10,134,815 B2 | 11/2018 | So et al. | |
| 2002/0027206 A1 | 3/2002 | Yuan et al. | |
| 2002/0066904 A1 | 6/2002 | Yuan et al. | |
| 2002/0130248 A1 | 9/2002 | Bretschneider et al. | |
| 2003/0122749 A1 | 7/2003 | Booth, Jr. et al. | |
| 2003/0168599 A1 | 9/2003 | Liddiard | |
| 2003/0218166 A1 | 11/2003 | Tsutsui | |
| 2004/0016923 A1 | 1/2004 | Yu et al. | |
| 2004/0027059 A1 | 2/2004 | Tsutsui | |
| 2004/0031965 A1 | 2/2004 | Forrest et al. | |
| 2004/0135222 A1 | 7/2004 | Alfano et al. | |
| 2004/0222306 A1 | 11/2004 | Fajarillo | |
| 2004/0253759 A1 | 12/2004 | Garber et al. | |
| 2004/0262614 A1 | 12/2004 | Hack et al. | |
| 2005/0077539 A1 | 4/2005 | Lipson | |
| 2005/0088079 A1 | 4/2005 | Daniels | |
| 2005/0088365 A1 | 4/2005 | Yamazaki et al. | |
| 2005/0104089 A1 | 5/2005 | Engelmann et al. | |
| 2005/0110007 A1 | 5/2005 | Forrest et al. | |
| 2005/0120946 A1 | 6/2005 | Hines et al. | |
| 2005/0126628 A1 | 6/2005 | Scher et al. | |
| 2005/0137301 A1 | 6/2005 | Wu et al. | |
| 2005/0155641 A1 | 7/2005 | Fafard | |
| 2005/0156609 A1 | 7/2005 | Pfaff et al. | |
| 2005/0161703 A1 | 7/2005 | Costello | |
| 2005/0168137 A1 | 8/2005 | Adamovich et al. | |
| 2005/0236556 A1 | 10/2005 | Sargent et al. | |
| 2006/0011927 A1 | 1/2006 | Ko | |
| 2006/0024526 A1 | 2/2006 | Thompson et al. | |
| 2006/0032528 A1 | 2/2006 | Wang | |
| 2006/0043361 A1 | 3/2006 | Lee et al. | |
| 2006/0081840 A1 | 4/2006 | Mori et al. | |
| 2006/0084347 A1 | 4/2006 | Tutt et al. | |
| 2006/0097247 A1 | 5/2006 | Kim et al. | |
| 2006/0157806 A1 | 7/2006 | Rhodes | |
| 2006/0180197 A1 | 8/2006 | Gui et al. | |
| 2006/0186803 A1 | 8/2006 | Lim et al. | |
| 2006/0192125 A1 | 8/2006 | Yoganandan et al. | |
| 2006/0222979 A1 | 10/2006 | Ishida et al. | |
| 2006/0227531 A1 | 10/2006 | Iou | |
| 2006/0266998 A1 | 11/2006 | Vega et al. | |
| 2006/0290270 A1 | 12/2006 | Kim et al. | |
| 2007/0029482 A1 | 2/2007 | Laou et al. | |
| 2007/0048548 A1 | 3/2007 | Kim et al. | |
| 2007/0051876 A1 | 3/2007 | Sumi et al. | |
| 2007/0062576 A1 | 3/2007 | Duerr et al. | |
| 2007/0096085 A1 | 5/2007 | Rand et al. | |
| 2007/0102694 A1 | 5/2007 | Drndic et al. | |
| 2007/0116983 A1 | 5/2007 | Kanno et al. | |
| 2007/0129545 A1 | 6/2007 | Inoue et al. | |
| 2007/0176541 A1 | 8/2007 | Son et al. | |
| 2007/0215868 A1 | 9/2007 | Forrest et al. | |
| 2007/0216985 A1 | 9/2007 | Woodall et al. | |
| 2007/0221888 A1 | 9/2007 | Sakata | |
| 2007/0235753 A1 | 10/2007 | Debucquoy et al. | |
| 2008/0041447 A1 | 2/2008 | Tseng et al. | |
| 2008/0066802 A1 | 3/2008 | Reddy | |
| 2008/0110499 A1 | 5/2008 | Chen et al. | |
| 2008/0138797 A1 | 6/2008 | Hunt et al. | |
| 2008/0142075 A1 | 6/2008 | Reddy et al. | |
| 2008/0223445 A1 | 9/2008 | Marks et al. | |
| 2008/0272713 A1 | 11/2008 | Kang et al. | |
| 2009/0045728 A1 | 2/2009 | Murano et al. | |
| 2009/0115310 A1 | 5/2009 | Yamamoto | |
| 2009/0140238 A1 | 6/2009 | Brabec et al. | |
| 2009/0152664 A1 | 6/2009 | Klem et al. | |
| 2009/0206237 A1 | 8/2009 | Shannon et al. | |
| 2009/0206745 A1 | 8/2009 | Hwang et al. | |
| 2009/0208776 A1 | 8/2009 | Liu et al. | |
| 2009/0214967 A1 | 8/2009 | Iwanaga et al. | |
| 2009/0217967 A1 | 9/2009 | Hovel et al. | |
| 2009/0223566 A1 | 9/2009 | Mitsui et al. | |
| 2009/0286338 A1 | 11/2009 | Coe-Sullivan et al. | |
| 2009/0301556 A1 | 12/2009 | Kawano et al. | |

(56) References Cited

U.S. PATENT DOCUMENTS

| | | |
|---|---|---|
| 2009/0321726 A1 | 12/2009 | Thompson |
| 2010/0025662 A1 | 2/2010 | Cho et al. |
| 2010/0044676 A1 | 2/2010 | Sargent et al. |
| 2010/0044767 A1 | 2/2010 | Chaudhry et al. |
| 2010/0059097 A1 | 3/2010 | McDonald et al. |
| 2010/0116995 A1 | 5/2010 | Levene et al. |
| 2010/0133418 A1 | 6/2010 | Sargent et al. |
| 2010/0133434 A1 | 6/2010 | Meng et al. |
| 2010/0133522 A1 | 6/2010 | Pieh et al. |
| 2010/0141122 A1 | 6/2010 | Begley et al. |
| 2010/0181552 A1 | 7/2010 | So |
| 2010/0229921 A1 | 9/2010 | Farris et al. |
| 2010/0233842 A1 | 9/2010 | Grein et al. |
| 2010/0243053 A1 | 9/2010 | Coe-Sullivan et al. |
| 2010/0282309 A1 | 11/2010 | Pschirer et al. |
| 2010/0294936 A1 | 11/2010 | Boeberl et al. |
| 2010/0302419 A1 | 12/2010 | Den Boer et al. |
| 2010/0326506 A1 | 12/2010 | Lifshitz et al. |
| 2011/0012091 A1 | 1/2011 | Forrest et al. |
| 2011/0031399 A1 | 2/2011 | So |
| 2011/0031403 A1 | 2/2011 | So |
| 2011/0049489 A1 | 3/2011 | Forrest et al. |
| 2011/0068330 A1 | 3/2011 | Akimoto et al. |
| 2011/0073835 A1 | 3/2011 | Ren et al. |
| 2011/0079706 A1 | 4/2011 | Michalewicz |
| 2011/0114921 A1 | 5/2011 | Yang et al. |
| 2011/0116078 A1 | 5/2011 | Cho et al. |
| 2011/0140075 A1 | 6/2011 | Zhou et al. |
| 2011/0248249 A1 | 10/2011 | Forrest et al. |
| 2011/0303906 A1 | 12/2011 | Goldman |
| 2012/0068140 A1 | 3/2012 | Greenham et al. |
| 2012/0126204 A1 | 5/2012 | So et al. |
| 2012/0187295 A1 | 7/2012 | So et al. |
| 2012/0193689 A1 | 8/2012 | Park et al. |
| 2012/0241723 A1 | 9/2012 | Klem et al. |
| 2012/0286296 A1 | 11/2012 | So et al. |
| 2013/0044250 A1 | 2/2013 | Senda et al. |
| 2013/0206988 A1 | 8/2013 | So |
| 2013/0215496 A1 | 8/2013 | Ban et al. |
| 2014/0054540 A1 | 2/2014 | Zhou et al. |
| 2014/0060613 A1 | 3/2014 | So et al. |
| 2014/0111652 A1 | 4/2014 | So et al. |
| 2014/0217284 A1 | 8/2014 | So et al. |
| 2014/0326921 A1 | 11/2014 | Lu et al. |
| 2014/0353502 A1 | 12/2014 | So et al. |
| 2014/0367572 A1 | 12/2014 | So et al. |
| 2015/0001395 A1 | 1/2015 | So et al. |
| 2015/0151980 A1 | 6/2015 | Tisdale et al. |
| 2015/0372046 A1 | 12/2015 | Kim et al. |
| 2017/0117335 A1 | 4/2017 | So et al. |

FOREIGN PATENT DOCUMENTS

| | | | |
|---|---|---|---|
| CN | 1773732 A | | 5/2006 |
| CN | 1806343 A | | 7/2006 |
| CN | 1856888 A | | 11/2006 |
| CN | 101340749 A | | 1/2009 |
| CN | 101405888 A | | 4/2009 |
| CN | 101421664 A | | 4/2009 |
| CN | 101558348 A | | 10/2009 |
| CN | 101794834 A | | 8/2010 |
| CN | 101872793 A | | 10/2010 |
| CN | 102725616 A | | 10/2012 |
| EP | 0 508 970 A1 | | 10/1992 |
| EP | 0 848 433 A2 | | 6/1998 |
| EP | 0 569 257 B1 | | 6/2002 |
| EP | 1 351 558 A1 | | 10/2003 |
| EP | 1 498 960 A2 | | 1/2005 |
| JP | S58-215081 A | | 12/1983 |
| JP | S60-030163 A | | 2/1985 |
| JP | S61-149831 A | | 7/1986 |
| JP | S63-088872 A | | 4/1988 |
| JP | S64-012583 A | | 1/1989 |
| JP | H02-016421 A | | 1/1990 |
| JP | H02-24279 A | | 9/1990 |
| JP | H03-079693 A | | 4/1991 |
| JP | H07-122762 A | | 5/1995 |
| JP | H07-175420 A | | 7/1995 |
| JP | H08-007096 A | | 1/1996 |
| JP | H08-007096 B2 | | 1/1996 |
| JP | H10-065200 A | | 3/1998 |
| JP | H10-242493 A | | 9/1998 |
| JP | H11-329736 A | | 11/1999 |
| JP | 2000-277265 A | | 10/2000 |
| JP | 2000-349365 A | | 12/2000 |
| JP | 2001-006876 A | | 1/2001 |
| JP | 2001-076882 A | | 3/2001 |
| JP | 2002-523904 A | | 7/2002 |
| JP | 2002-340668 A | | 11/2002 |
| JP | 2003-083809 A | | 3/2003 |
| JP | 2003-178887 A | | 6/2003 |
| JP | 2004-511911 A | | 4/2004 |
| JP | 2005-522005 A | | 7/2005 |
| JP | 2005-266537 A | | 9/2005 |
| JP | 2005-277113 A | | 10/2005 |
| JP | 2006-013103 A | | 1/2006 |
| JP | 2006-066395 A | | 3/2006 |
| JP | 2006-128437 A | | 5/2006 |
| JP | 2006-518110 A | | 8/2006 |
| JP | 2006-251555 A | | 9/2006 |
| JP | 2007-519237 A | | 7/2007 |
| JP | 2008-016831 A | | 1/2008 |
| JP | 2008-053736 A | | 3/2008 |
| JP | 2008-523615 A | | 7/2008 |
| JP | 2009-509129 A | | 3/2009 |
| JP | 2009-520358 A | | 5/2009 |
| JP | 2009-527108 A | | 7/2009 |
| JP | 2009-192919 A | | 8/2009 |
| JP | 2009-531837 A | | 9/2009 |
| JP | 2009-253173 A | | 10/2009 |
| JP | 2009-272528 A | | 11/2009 |
| JP | 2010-506386 A | | 2/2010 |
| JP | 2010-067642 A | | 3/2010 |
| JP | 2010-067802 A | | 3/2010 |
| JP | 2010-087205 A | | 4/2010 |
| JP | 2010-192931 A | | 9/2010 |
| JP | 2010-263030 A | | 11/2010 |
| JP | 2010-534409 A | | 11/2010 |
| JP | 2011-098948 A | | 5/2011 |
| JP | 2012-524991 A | | 10/2012 |
| JP | 2013-512439 A | | 4/2013 |
| JP | 2014-511041 A | | 5/2014 |
| KR | 1020090080056 A | | 7/2009 |
| TW | 200637425 A | | 10/2006 |
| TW | 200847449 A | | 12/2008 |
| TW | 201041203 A | | 11/2010 |
| WO | WO 02/099896 A1 | | 12/2002 |
| WO | WO 03/084292 A1 | | 10/2003 |
| WO | WO 2004/073082 A1 | | 8/2004 |
| WO | WO 2005/069387 A1 | | 7/2005 |
| WO | WO 2005/101530 A1 | | 10/2005 |
| WO | WO 2006/130717 A2 | | 12/2006 |
| WO | WO 2007/017475 A1 | | 2/2007 |
| WO | WO 2007/095386 A1 | | 8/2007 |
| WO | WO 2007/102051 A2 | | 9/2007 |
| WO | WO 2007/131126 A2 | | 11/2007 |
| WO | WO 2008/042859 A2 | | 4/2008 |
| WO | WO 2008/054845 A2 | | 5/2008 |
| WO | WO 2008/140601 A1 | | 11/2008 |
| WO | WO 2009/074993 A2 | | 6/2009 |
| WO | WO 2009/116511 A1 | | 9/2009 |
| WO | WO 2010/070563 A2 | | 6/2010 |
| WO | WO 2010/120393 A2 | | 10/2010 |
| WO | WO 2010/142575 A2 | | 12/2010 |
| WO | WO 2010/142947 A1 | | 12/2010 |
| WO | WO 2011/033974 A1 | | 3/2011 |
| WO | WO 2011/066396 A2 | | 6/2011 |
| WO | WO 2012/138651 A2 | | 10/2012 |
| WO | WO 2012/168192 A2 | | 12/2012 |
| WO | WO 2012/170457 A2 | | 12/2012 |
| WO | WO 2012/178071 A2 | | 12/2012 |
| WO | WO 2013/003850 A2 | | 1/2013 |
| WO | WO 2015/081005 A1 | | 6/2015 |

(56) References Cited

FOREIGN PATENT DOCUMENTS

OTHER PUBLICATIONS

Extended European Search Report dated May 27, 2016 for Application No. EP 11787262.2.
Extended European Search Report dated Jul. 25, 2016 in connection with Application No. EP 14791448.5.
Extended European Search Report dated Nov. 3, 2014 in connection with Application No. EP 11843638.5.
Extended European Search Report dated Apr. 20, 2015 in connection with Application No. EP 12797523.3.
Extended European Search Report dated Feb. 4, 2015 in connection with Application No. EP 12804913.7.
Extended European Search Report for European Application No. 11859661.8 dated Jun. 26, 2017.
Extended European Search Report for European Application No. 12825553.6 dated Dec. 12, 2017.
Extended European Search Report dated Sep. 8, 2014 in connection with Application No. 1276466.1.
International Search Report dated Jun. 25, 2008 in connection with Application No. PCT/US2007/080104.
International Preliminary Report on Patentability dated Mar. 31, 2009 in connection with Application No. PCT/US2007/080104.
International Search Report and Written Opinion dated Jul. 29, 2011 in connection with Application No. PCT/US2010/058015.
International Search Report and Written Opinion dated Jan. 4, 2012, in connection with Application No. PCT/US2011/037772.
International Search Report and Written Opinion dated Nov. 24, 2014 in connection with Application No. PCT/US2014/012722.
Third Party Observation dated Feb. 12, 2015 in connection with Application No. PCT/US2014/012722.
International Search Report and Written Opinion dated Mar. 6, 2012 in connection with Application No. PCT/US2011/056180.
International Search Report and Written Opinion dated Jan. 29, 2013 in connection with Application No. PCT/US2012/040980.
International Search Report and Written Opinion dated Jan. 7, 2013 in connection with Application No. PCT/US2012/045272.
International Search Report and Written Opinion dated Mar. 19, 2012 in connection with Application No. PCT/US2011/056178.
International Search Report and Written Opinion dated Nov. 23, 2012 in connection with Application No. PCT/US2012/026920.
International Search Report and Written Opinion dated Oct. 31, 2012 in connection with Application No. PCT/US2012/031988.
International Search Report and Written Opinion dated Mar. 3, 2017 for Application No. PCT/US2016/037056.
[No Author Listed] OLED Display for Thermal Imaging Helmet, Military and Aerospace Electronics. Oct. 7, 2003. http://www.militaryaerospace.com/articles/2003/10/oled-display-for-thermal-imagin-helmut [last accessed Dec. 8, 2014]. 2 pages.
[No Author Listed], Background Information on CCD and CMOS Technology. Ted Pella, Inc. https://www.tedpella.com/cameras_htmlccd_cmos.htm 2009. p. 1-3.
Ban et al., 1.5 μm Optical Up-Conversion: Wafter Fusion and Related Issues. Proc SPIE. 2004;5543:47-55.
Ban et al., Near-infrared to visible light optical upconversion by direct tandem integration of organic light-emitting diode and inorganic photodetector. Appl Phys Lett. Feb. 27, 2007;90(9):93108.1-3.
Carlson et al., Amorphous silicon solar cell. Appl Phys Lett. 1976;28:671.
Chen et al., Near-infrared inorganic/organic optical upconverter with an external power efficiency of >100%. Adv Mater. Nov. 16, 2010;22(43):4900-4. doi: 10.1002/adma.201001946.
Chen et al., Near-infrared optical upconverter based on i-In0.53Ga0.47As/C60 photovoltaic heterojunction. Electron Lett. Jul. 2009;45(14):753-5.
Chikamatsu et al., Light up-conversion from near-infrared to blue using a photoresponsive organic light-emitting device. Appl Phys Lett. Jul. 22, 2002;81(4):769-71.

Chikamatsu et al., Photoresponsive organic electroluminescent devices. J Photochem Photobiol A: Chem. Jun. 1, 2003;158(2-3):215-8.
Gong et al., High-Detectivity Polymer Photodetectors with Special Response from 300 nm to 1450 nm. Sci. Sep. 25, 2009;325:1665-7.
Gong et al., Semiconducting Polymer Photodetectors with Electron and Hole Blocking Layers: High Detectivity in the Near-Infrared. Sensors. Jul. 1, 2010;10:6488-96.
Im et al., Near-infrared photodetection based on PbS colloidal quantum dots/organic hole conductor. Org Electron. Jan. 4, 2010;11(4):696-9.
Kim et al., Organic infrared upconversion device. Adv Mater. May 25, 2010;22(20):2260-3. doi: 10.1002/adma.200903312.
Kim et al., PbSe nanocrystal-based infrared-to-visible up-conversion device. Nano Lett. May 11, 2011;11(5):2109-13. doi: 10.1021/nl200704h. Epub Apr. 19, 2011. 5 pages.
Kim, Organic Photovoltaic Cells and Organic Up-Convertion Devices. University of Florida. Thesis. May 31, 2009. 173 pages.
Konstantatos et al., Solution-Processed Quantum Dot Photodetectors. Proc IEEE. Oct. 2009;97(10):1666-83.
Konstantatos, Sensitive solution-processed quantum dot photodetectors. PhD Thesis Graduate Dept of Electrical and Computer Engineering. University of Toronto. 2008:133 pages.
Lepnev et al., Two-diode organic light amplifiers/converters and peculiarities of photocurrent multiplaction. Synth Met. Apr. 5, 2006;156(7-8):624-32.
Luo et al., Optical upconverter with integrated heterojunction phototransistor and light-emitting diode. Appl Phys Lett. Feb. 2006;88(7):73501.1-3.
McDonald et al., Solution-processed PbS quantum dot infrared photodetectors and photovoltaics. Nat Mater. Feb. 2005;4:138-43. Supplementary Figure. 1 page.
Mustafa et al., Solution processed nickel oxide anodes for organic photovoltaic devices. Appl Phys Lett. 2014;104(6):e063302.1-5.
Ni et al., Organic light-emitting diode with TiOPc layer—A new multifunctional optoelectronic device. Jpn J Appl Phys. 2001;40:L948-51. doi:10.1143/JJAP.40.L948.
Overton, Detectors: Near-IR image uses quantum-dot-sensitized photodiodes. Laser Focus World. Sep. 2009:25-8.
Sarasqueta et al., Organic and inorganic blocking layers for solution-processed colloidal PbSe nanocrystal infrared photodetectors. Adv Funct Mater. 2011;21(1):167-71.
Sargent, Infrared Quantum Dots. Adv Mater. Mar. 8, 2005;17(5):515-22.
Wagner et al., Change of electrochemical impedance spectra (EIS) with time during CO-poisoning of the PT-anode in a membrane fuel cell. J Power Science. Mar. 10, 2004;127(1-2):341-7.
Wang et al., Correlation between mechanical stress and optical properties of SiO2/Ta2O5 multilayer UV narrow-bandpass filters deposited by plasma ion-assisted deposition. Proc of SPIE. Aug. 2005;5870:58700e.1-9.
Xie et al., InAs/InP/ZnSe Core/Shell/Shell Quantum Dots as Near-Infrared Emitters: Bright, Narrow-Band, Non-Cadmium Containing, and Biocompatible. Nano Res. 2008;1:457-64.
Yang et al., Semiconductor infrared up-conversion devices. Prog Quant Electr. 2011;35:77-108.
Yase et al., Organic Light-emitting Devices with Photoresponsive Layer. Pacific Rim Conference on Lasers and Electro-Optics. Tokyo, Japan. Jul. 11-15, 2005;569-70.
Yin et al., Colloidal nanocrystal synthesis and the organic-inorganic interface. Nature. Sep. 29, 2005;437:664-70.
Summons to Attend Oral Proceedings for European Application No. 12804913.7 dated Aug. 14, 2018.
Borsenberger et al., Hole transport in 1, 1-bis(di-4-tolylaminophenyl)cyclohexane. Journal of Chemical Physics. 1991;94(12):8276-81.
Burgi et al., A microscopic view of charge transport in polymer transistors. Synthetic Me. 2004;146(3):297-309.
Kulkarni et al., High-Performance Organic Light-Emitting Diodes Based on Intramolecular Charge-Transfer Emission from Donor-Acceptor Molecules: Significance of Electron-Donor Strength and Molecular Geometry. Advanced Functional Materials. 2006;16(8):1057-66.

(56) References Cited

OTHER PUBLICATIONS

Sun et al., White light from polymer light-emitting diodes: Utilization of fluorenone defects and exciplex. Applied Physics Letters. 2006;88(16):163510.

Chinese First Office Action dated Mar. 25, 2019 for Chinese Application No. 201680033386.3.

Extended European Search Report for European Application No. 16842459.6 dated Feb. 18, 2019.

Shen et al., Role of Electrode Contamination in Electron Injection at Mg:Ag/Alq3 Interfaces. Adv. Matter. 1999;11(8):1523-7.

Weidman et al., Monodisperse, Air-Stable PbS Nanocrystals via Precursor Stoichiometry Control. ACS Nano. 2014;8(6):6363-71. DOI: 10.1021/nn5018654.

Lee et al., Unraveling the Gain Mechanism in High Performance Solution-Processed PbS Infrared PIN Photodiodes. Advanced Functional Materials. 2015;25:1233-1238.

MONODISPERSE, IR-ABSORBING NANOPARTICLES AND RELATED METHODS AND DEVICES

CROSS-REFERENCE TO RELATED APPLICATIONS

This application is a National Phase Entry of international PCT patent application No. PCT/US2016/037056, entitled "MONODISPERSE, IR-ABSORBING NANOPARTICLES AND RELATED METHODS AND DEVICES" filed on Jun. 10, 2016, which claims priority to and the benefits of U.S. Provisional Application Ser. No. 62/174,015, entitled "MONODISPERSE, IR-ABSORBING NANOPARTICLES AND RELATED METHODS AND DEVICES" filed on Jun. 11, 2015. The entire contents of these applications are incorporated herein by reference in their entirety.

FIELD

The present invention generally relates to monodisperse nanoparticles and, in particular, to monodisperse, infrared-absorbing nanoparticles.

BACKGROUND

Devices that are capable of absorbing infrared (IR) radiation, such as IR photodetectors, IR-to-visible up-conversion devices, and IR solar cells, have been attracting an increasing amount of attention due to their applicability to a wide range of fields, including night vision, image sensors, and renewable energy.

Certain nanoparticles show promise as IR-absorbing materials for use in IR-absorbing devices. For example, PbS nanoparticles generally exhibit excellent photosensitivity and bandgap tunability in at least a portion of the IR spectrum. However, due to the limitations of nanoparticle synthesis methods known in the art, PbS nanoparticles are mainly used in current devices to absorb electromagnetic radiation having a wavelength of less than about 1 μm. Accordingly, in order to capture portions of the IR spectrum having longer wavelengths, improved nanoparticle synthesis methods are needed.

SUMMARY

The present application generally relates to monodisperse nanoparticles and, in particular, to monodisperse, infrared-absorbing nanoparticles. The subject matter of the present application involves, in some cases, interrelated products, alternative solutions to a particular problem, and/or a plurality of different uses of one or more systems and/or articles.

In one aspect, a device is described. In some embodiments, the device comprises a layer comprising a plurality of nanocrystals, wherein the plurality of nanocrystals has a mean maximum cross-sectional dimension of about 2 nm or more with a relative standard deviation of about 10% or less. In some embodiments, the plurality of nanocrystals is capable of absorbing electromagnetic radiation having a wavelength of at least about 700 nm.

In another aspect, a method of forming a plurality of nanocrystals is described. In some embodiments, the method comprises adding a first amount of a first solution to a second solution to form a first mixed solution, wherein the first solution comprises a first element and the second solution comprises a second element, wherein the molar ratio of the first element to the second element in the first mixed solution is above a nucleation threshold. In certain embodiments, the method further comprises adding a second amount of the first solution to the first mixed solution to form a second mixed solution, wherein the molar ratio of the first element to the second element in the second mixed solution is below the nucleation threshold. In some cases, a plurality of nanocrystals comprising the first element and the second element is formed, wherein the plurality of nanocrystals has a mean maximum cross-sectional dimension of about 2 nm or more with a relative standard deviation of about 10% or less. In some cases, the plurality of nanocrystals is capable of absorbing electromagnetic radiation having a wavelength of at least about 700 nm.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1:
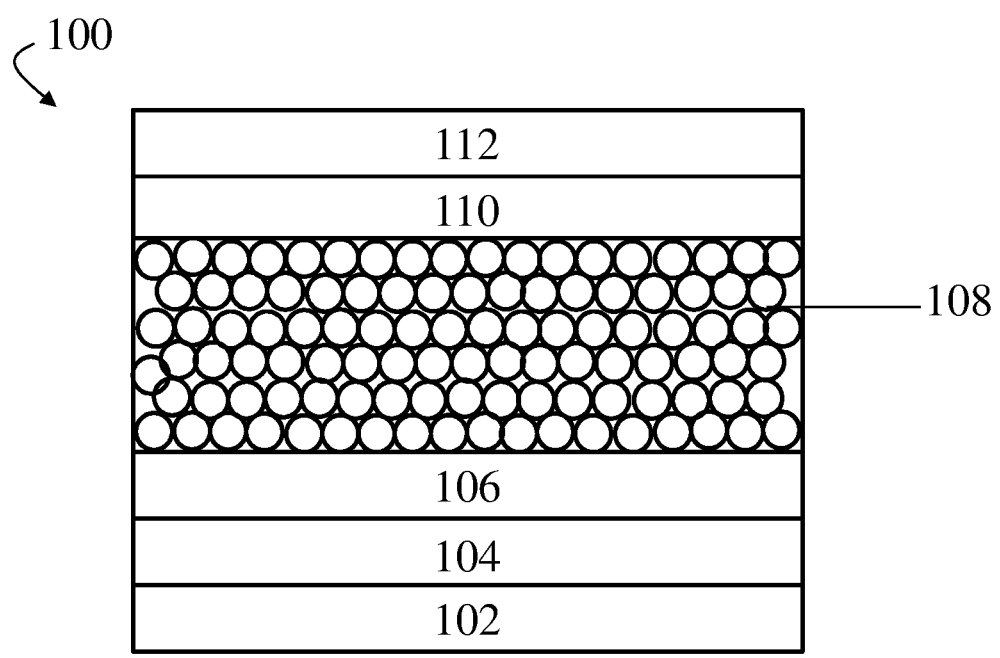
FIG. 1 shows a cross-sectional schematic illustration of an IR photodetector, according to some embodiments.

Embodiments described herein generally relate to monodisperse nanoparticles that are capable of absorbing infrared (IR) radiation and generating charge carriers (e.g., electrons, holes). In some cases, at least a portion of the nanoparticles are nanocrystals. In certain embodiments, the monodisperse, IR-absorbing nanocrystals are formed according to a method comprising a nanocrystal formation step comprising adding a first precursor solution comprising a first element of the nanocrystal to a second precursor solution comprising a second element of the nanocrystal to form a first mixed precursor solution, where the molar ratio of the first element to the second element in the first mixed precursor solution is above a nucleation threshold. The method may further comprise a nanocrystal growth step comprising adding the first precursor solution to the first mixed precursor solution to form a second mixed precursor solution, where the molar ratio of the first element to the second element in the second mixed precursor solution is below the nucleation threshold. According to some embodiments, a layer of the nanocrystals may be included in devices such as an IR photodetector, an IR-to-visible up-conversion device, and/or an IR solar cell.

It has been recognized that it may be advantageous, in some cases, for a device to comprise relatively large nanoparticles (e.g., nanoparticles having a maximum cross-sectional dimension of about 2 nm or more). In certain cases, the absorption properties of a nanoparticle are size-dependent. For example, some nanoparticles, such as semiconductor nanoparticles, comprise a valence band (e.g., a highest occupied energy level) and a conduction band (e.g., a lowest unoccupied energy level), and a band gap exists between the valence band and the conduction band. Under certain conditions, a photon having an energy larger than the band gap may excite an electron from the valence band to the conduction band, resulting in an electron-hole pair (e.g., an exciton). In certain cases, changing the size of a nanoparticle may change the band gap and, thus, the absorption properties of the nanoparticle. In some cases, a larger nanoparticle may be capable of absorbing electromagnetic radiation having a longer wavelength and generating charge carriers. It may be advantageous in certain applications to absorb IR radiation having a relatively long wavelength (e.g., at least about 1 μm). For example, such nanoparticles may permit devices to access different portions of the electromagnetic spectrum than were previously available.

It has also been recognized that it may be advantageous, in some cases, for the nanoparticles of an IR-absorbing device to be relatively monodisperse (e.g., having substantially uniform size). For example, a population of relatively monodisperse nanoparticles may have relatively similar absorption properties and may be used in a device to selectively absorb IR radiation of a particular wavelength. In some applications, such as IR solar cells, monodisperse nanoparticles may increase charge extraction and, accordingly, increase the efficiency of the solar cell.

However, a number of challenges have been associated with the synthesis of relatively large, monodisperse nanoparticles. For example, prior art methods generally have been unable to synthesize populations of relatively large nanoparticles of relatively high quality (e.g., low defect density). This inability may be at least partially attributed to the fact that synthesis of relatively large nanoparticles typically requires high growth temperatures and/or long growth times, which are often associated with high defect densities. In addition, prior art methods generally have been unable to synthesize populations of relatively large nanoparticles that are relatively monodisperse. In prior art methods, for example, uncontrollable nucleation has led to broad size distributions. That is, the formation of nuclei throughout the nanoparticle synthesis process has resulted in nanoparticles having a wide range of sizes (e.g., nanoparticles formed earlier in the process are generally larger than nanoparticles formed later in the process). Additionally, the high growth temperatures and/or long growth times typically required for relatively large nanoparticles have led to increased size dispersion.

It has unexpectedly been discovered that relatively large, monodisperse nanoparticles may be synthesized according to novel methods comprising multiple phases. In some cases, a method comprises a first phase having conditions that favor nanoparticle formation (e.g., nucleation) and a second phase having conditions that favor nanoparticle growth instead of nanoparticle formation. In some embodiments, nanoparticle formation is initiated by injecting a first precursor solution comprising a first element of the nanoparticle into a second precursor solution comprising a second element of the nanoparticle to form a mixed precursor solution, where the molar ratio of the first element to the second element in the mixed precursor solution is above a nucleation threshold. This initial injection may, according to some embodiments, result in the formation of a plurality of nanoparticles. In some embodiments, the method further comprises one or more additional injections of the first precursor solution into the mixed precursor solution, where the molar ratio of the first element to the second element in the mixed precursor solution (e.g., the ratio of the number of moles of the first element not bound to a nanoparticle to the number of moles of the second element not bound to a nanoparticle) is lower than the nucleation threshold. It has been discovered that nucleation may be suppressed by ensuring that the molar ratio of the first element to the second element does not exceed the nucleation threshold after the initial injection. By confining nanoparticle formation to the initial injection step, rather than allowing nanoparticle formation to occur throughout the synthesis process, relatively monodisperse nanoparticles may be formed. In some cases, the one or more additional injections of the first precursor solution may contribute to growth of existing nanoparticles instead of formation of new nanoparticles, leading to relatively large nanoparticles.

Some aspects are directed to a plurality of relatively large nanoparticles. One suitable measure of particle size is, for example, mean maximum cross-sectional dimension. As used herein, the "maximum cross-sectional dimension" of a nanoparticle refers to the largest distance between two opposed boundaries of the nanoparticle that may be measured (e.g., diameter). The "mean maximum cross-sectional dimension" of a plurality of nanoparticles generally refers to the number average of the maximum cross-sectional dimensions of the nanoparticles (e.g., the sum of the maximum cross-sectional dimensions divided by the number of nanoparticles in the plurality of nanoparticles). One of ordinary skill in the art would be capable of determining the mean maximum cross-sectional dimension of a plurality of nanoparticles using, for example, transmission electron microscopy (TEM). Generally, in TEM, a beam of electrons interacts with a specimen as it passes through the specimen, and an image is formed from the interaction. From one or more TEM images of a specimen comprising a plurality of nanoparticles, the number of nanoparticles in the specimen and the maximum cross-sectional dimensions of individual nanoparticles within the plurality of nanoparticles may be determined (e.g., using image analysis software), and the mean maximum cross-sectional dimension may be calculated.

In some embodiments, a plurality of nanoparticles has a mean maximum cross-sectional dimension of at least about 1 nm, at least about 2 nm, at least about 3 nm, at least about 4 nm, at least about 5 nm, at least about 6 nm, at least about 7 nm, at least about 8 nm, at least about 9 nm, at least about 10 nm, at least about 15 nm, at least about 18 nm, at least about 20 nm, at least about 30 nm, at least about 40 nm, at least about 50 nm, at least about 60 nm, at least about 70 nm, at least about 80 nm, at least about 90 nm, or at least about 100 nm. In certain cases, a plurality of nanoparticles has a mean maximum cross-sectional dimension in the range of about 1 nm to about 10 nm, about 1 nm to about 15 nm, about 1 nm to about 18 nm, about 1 nm to about 20 nm, about 1 nm to about 50 nm, about 1 nm to about 80 nm, about 1 nm to about 100 nm, about 5 nm to about 10 nm, about 5 nm to about 15 nm, about 5 nm to about 18 nm, about 5 nm to about 20 nm, about 5 nm to about 50 nm, about 5 nm to about 80 nm, about 5 nm to about 100 nm, about 10 nm to about 18 nm, about 10 nm to about 20 nm, about 10 nm to about 50 nm, about 10 nm to about 80 nm, about 10 nm to about 100 nm, about 15 nm to about 20 nm, about 15 nm to about 50 nm, about 15 nm to about 80 nm, about 15 nm to about 100 nm, about 20 nm to about 50 nm, about 20 nm to about 80 nm, about 20 nm to about 100 nm, or about 50 nm to about 100 nm.

Another suitable measure of particle size is median maximum cross-sectional dimension. The "median maximum cross-sectional dimension" of a plurality of nanoparticles generally refers to the numerical value at which half the nanoparticles have a larger maximum cross-sectional dimension and half the nanoparticles have a smaller maximum cross-sectional dimension. One of ordinary skill in the art would be capable of determining the median maximum cross-sectional dimension of a plurality of nanoparticles using, for example, TEM. From one or more TEM images of a specimen comprising a plurality of nanoparticles, the maximum cross-sectional dimensions of individual nanoparticles within the plurality of nanoparticles may be measured (e.g., using image analysis software), and the median maximum cross-sectional dimension of the plurality of nanoparticles may be determined.

In some embodiments, a plurality of nanoparticles has a median maximum cross-sectional dimension of at least about 1 nm, at least about 2 nm, at least about 3 nm, at least about 4 nm, at least about 5 nm, at least about 6 nm, at least about 7 nm, at least about 8 nm, at least about 9 nm, at least about 10 nm, at least about 15 nm, at least about 18 nm, at least about 20 nm, at least about 30 nm, at least about 40 nm, at least about 50 nm, at least about 60 nm, at least about 70 nm, at least about 80 nm, at least about 90 nm, or at least about 100 nm. In certain cases, a plurality of nanoparticles has a median maximum cross-sectional dimension in the range of about 1 nm to about 10 nm, about 1 nm to about 15 nm, about 1 nm to about 18 nm, about 1 nm to about 20 nm, about 1 nm to about 50 nm, about 1 nm to about 80 nm, about 1 nm to about 100 nm, about 5 nm to about 10 nm, about 5 nm to about 15 nm, about 5 nm to about 18 nm, about 5 nm to about 20 nm, about 5 nm to about 50 nm, about 5 nm to about 80 nm, about 5 nm to about 100 nm, about 10 nm to about 18 nm, about 10 nm to about 20 nm, about 10 nm to about 50 nm, about 10 nm to about 80 nm, about 10 nm to about 100 nm, about 15 nm to about 20 nm, about 15 nm to about 50 nm, about 15 nm to about 80 nm, about 15 nm to about 100 nm, about 20 nm to about 50 nm, about 20 nm to about 80 nm, about 20 nm to about 100 nm, or about 50 nm to about 100 nm.

Some embodiments are directed to a plurality of nanoparticles capable of absorbing electromagnetic radiation having relatively long wavelengths (e.g., IR radiation). In certain cases, the nanoparticles are capable of absorbing IR radiation and generating charge carriers (e.g., electrons and holes). In some embodiments, the nanoparticles are capable of absorbing radiation having a wavelength of at least about 700 nm, at least about 800 nm, at least about 900 nm, at least about 1000 nm, at least about 1100 nm, at least about 1200 nm, at least about 1300 nm, at least about 1400 nm, at least about 1500 nm, at least about 1600 nm, at least about 1700 nm, at least about 1800 nm, at least about 1900 nm, at least about 2000 nm, at least about 2200 nm, at least about 2500 nm, at least about 2800 nm, at least about 3000 nm, at least about 3300 nm, at least about 3500 nm, at least about 3800 nm, at least about 4000 nm, at least about 4500 nm, at least about 5000 nm, at least about 10 µm, or at least about 20 µm. In some embodiments, the nanoparticles are capable of absorbing radiation having a wavelength in the range of about 700 nm to about 1500 nm, about 700 nm to about 1800 nm, about 700 nm to about 2000 nm, about 700 nm to about 2500 nm, about 700 nm to about 3000 nm, about 700 nm to about 3500 nm, about 700 nm to about 4000 nm, about 700 nm to about 4500 nm, about 700 nm to about 5000 nm, about 700 nm to about 10 µm, about 700 nm to about 20 µm, about 800 nm to about 1500 nm, about 800 nm to about 1800 nm, about 800 nm to about 2000 nm, about 800 nm to about 2500 nm, about 800 nm to about 3000 nm, about 800 nm to about 3500 nm, about 800 nm to about 4000 nm, about 800 nm to about 4500 nm, about 800 nm to about 5000 nm, about 800 nm to about 10 µm, about 800 nm to about 20 µm, about 1000 nm to about 1500 nm, about 1000 nm to about 1800 nm, about 1000 nm to about 2000 nm, about 1000 nm to about 2500 nm, about 1000 nm to about 3000 nm, about 1000 nm to about 3500 nm, about 1000 nm to about 4000 nm, about 1000 nm to about 4500 nm, about 1000 nm to about 5000 nm, about 1000 nm to about 10 µm, about 1000 nm to about 20 µm, about 1500 nm to about 2000 nm, about 1500 nm to about 2500 nm, about 1500 nm to about 3000 nm, about 1500 nm to about 3500 nm, about 1500 nm to about 4000 nm, about 1500 nm to about 4500 nm, about 1500 nm to about 5000 nm, about 1500 nm to about 10 µm, about 1500 nm to about 20 µm, about 2000 nm to about 3000 nm, about 2000 nm to about 3500 nm, about 2000 nm to about 4000 nm, about 2000 nm to about 4500 nm, about 2000 nm to about 5000 nm, about 2000 nm to about 10 µm, about 2000 nm to about 20 µm, about 4000 nm to about 5000 nm, about 4000 nm to about 10 µm, about 4000 nm to about 20 µm, about 5000 nm to about 10 µm, about 5000 nm to about 20 µm, or about 10 µm to about 20 µm.

In some embodiments, the nanoparticles are also capable of absorbing ultraviolet (UV) and/or visible radiation and generating charge carriers. Accordingly, in some embodiments, the nanoparticles are capable of absorbing radiation having a wavelength in the range of about 350 nm to about 1500 nm, about 350 nm to about 1800 nm, about 350 nm to about 2000 nm, about 350 nm to about 2500 nm, about 350 nm to about 3000 nm, about 350 nm to about 3500 nm, about 400 nm to about 1500 nm, about 400 nm to about 1800 nm, about 400 nm to about 2000 nm, about 400 nm to about 2500 nm, about 400 nm to about 3000 nm, or about 400 nm to about 3500 nm.

The nanoparticles may have any suitable geometry. For example, the nanoparticles may be substantially spherical, substantially ellipsoidal, substantially cylindrical, substantially prismatic (e.g., triangular prismatic, rectangular prismatic), or may have an irregular shape.

In certain embodiments, at least a portion of the nanoparticles are nanocrystals (e.g., particles comprising atoms arranged in a highly ordered structure). The nanocrystals may have any crystal structure (e.g., rock-salt structure, zincblende structure). According to some embodiments, the nanocrystals may comprise single crystals or polycrystalline aggregates. In some embodiments, substantially all of the nanoparticles are nanocrystals.

In some embodiments, at least a portion of the nanoparticles are quantum dots. Quantum dots generally refer to semiconductor nanoparticles (e.g., nanocrystals) that have a sufficiently small size to exhibit quantum mechanical properties. For example, the excitons of quantum dots may be confined in three spatial dimensions (e.g., quantum confinement), and discrete energy levels may be observed. In some embodiments, substantially all of the nanoparticles are quantum dots.

According to some embodiments, the nanoparticles may comprise two or more types of atoms. For example, suitable materials for the nanoparticles include, but are not limited to, lead chalcogenides (e.g., PbS, PbSe, PbTe) and alloys thereof, silver chalcogenides (e.g., $Ag_2S$, $Ag_2Se$, $Ag_2Te$) and alloys thereof, mercury chalcogenides (e.g., HgS, HgSe, HgTe) and alloys thereof, cadmium chalcogenides (e.g., CdS, CdSe, CdTe) and alloys thereof, copper chalcogenides (e.g., $Cu_2S$, $Cu_2Se$, $Cu_2Te$) and alloys thereof, bismuth chalcogenides (e.g., $Bi_2S_3$, $Bi_2Se_3$, $Bi_2Te_3$) and alloys thereof, zinc chalcogenides (e.g., ZnS, ZnSe, ZnTe) and alloys thereof, and III-V semiconductors based on indium and/or gallium (e.g., GaN, GaP, GaAs, InP) and alloys thereof. In certain embodiments, at least a portion of the nanoparticles comprise lead and/or sulfur. In some cases, at least a portion of the nanoparticles comprise PbS and/or PbSe. In particular embodiments, substantially all of the nanoparticles comprise PbS and/or PbSe.

Some aspects are directed to a plurality of relatively monodisperse nanoparticles. As used herein, "monodisperse nanoparticles" refer to nanoparticles having substantially uniform size (e.g., maximum cross-sectional dimension). For example, one suitable measure of the monodispersity of a plurality of nanoparticles is standard deviation. Standard deviation σ may be calculated using Equation 1:

$$\sigma = \sqrt{\frac{1}{N}\sum_{i=1}^{N}(x_i - \bar{x})^2} \qquad (1)$$

where N is the number of nanoparticles, $\bar{x}$ is the mean maximum cross-sectional dimension, and $x_i$ is the maximum cross-sectional dimension of the $i^{th}$ nanoparticle. In some embodiments, the plurality of nanoparticles has a standard deviation of about 20 nm or less, about 15 nm or less, about 10 nm or less, about 8 nm or less, about 5 nm or less, about 4 nm or less, about 3 nm or less, about 2 nm or less, about 1.5 nm or less, about 1 nm or less, or about 0.5 nm or less. In certain embodiments, the plurality of nanoparticles has a standard deviation in the range of about 0.5 nm to about 1 nm, about 0.5 nm to about 1.5 nm, about 0.5 nm to about 2 nm, about 0.5 nm to about 3 nm, about 0.5 nm to about 4 nm, about 0.5 nm to about 5 nm, about 0.5 nm to about 8 nm, about 0.5 nm to about 10 nm, about 0.5 nm to about 15 nm, about 0.5 nm to about 20 nm, about 1 nm to about 2 nm, about 1 nm to about 3 nm, about 1 nm to about 4 nm, about 1 nm to about 5 nm, about 1 nm to about 8 nm, about 1 nm to about 10 nm, about 1 nm to about 15 nm, about 1 nm to about 20 nm, about 2 nm to about 5 nm, about 2 nm to about 8 nm, about 2 nm to about 10 nm, about 2 nm to about 15 nm, about 2 nm to about 20 nm, about 5 nm to about 10 nm, about 5 nm to about 15 nm, or about 5 nm to about 20 nm.

Another suitable measure of monodispersity is relative standard deviation, which may be calculated using Equation 2:

$$\% \, RSD = \frac{\sigma}{\bar{x}} \times 100 \qquad (2)$$

where $\sigma$ is the standard deviation (as calculated using Equation 1) of the maximum cross-sectional dimensions of a plurality of nanoparticles and $\bar{x}$ is the mean maximum cross-sectional dimension of the plurality of nanoparticles. In some embodiments, the relative standard deviation of the maximum cross-sectional dimensions of a plurality of nanoparticles is about 20% or less, about 15% or less, about 10% or less, about 5% or less, about 2% or less, or about 1% or less. In some embodiments, the relative standard deviation of the maximum cross-sectional dimensions of a plurality of nanoparticles is in the range of about 1% to about 2%, about 1% to about 5%, about 1% to about 10%, about 1% to about 15%, about 1% to about 20%, about 2% to about 5%, about 2% to about 10%, about 2% to about 15%, about 2% to about 20%, about 5% to about 10%, about 5% to about 15%, about 5% to about 20%, about 10% to about 15%, or about 10% to about 20%.

In some cases, absorption of IR radiation by a plurality of nanoparticles may result in a peak in an absorption spectrum (e.g., a plot of absorbance as a function of wavelength). The peak may be characterized by a full width at half maximum (FWHM) (e.g., the width of the peak when the absorbance is at half the maximum value). For example, a plurality of monodisperse particles may have an absorption peak having a FWHM that is smaller than the FWHM of an absorption peak of a plurality of polydisperse particles. In certain embodiments, a plurality of nanoparticles has an IR absorption peak having a FWHM of about 1 μm or less, about 500 nm or less, about 400 nm or less, about 300 nm or less, about 200 nm or less, about 100 nm or less, about 50 nm or less, about 20 nm or less, about 10 nm or less, about 5 nm or less, or about 1 nm or less. In some embodiments, a plurality of nanoparticles has an IR absorption peak having a FWHM in the range of about 1 nm to about 5 nm, about 1 nm to about 10 nm, about 1 nm to about 20 nm, about 1 nm to about 50 nm, about 1 nm to about 100 nm, about 1 nm to about 200 nm, about 1 nm to about 300 nm, about 1 nm to about 400 nm, about 1 nm to about 500 nm, about 1 nm to about 1 μm, about 5 nm to about 10 nm, about 5 nm to about 20 nm, about 5 nm to about 50 nm, about 5 nm to about 100 nm, about 5 nm to about 200 nm, about 5 nm to about 300 nm, about 5 nm to about 400 nm, about 5 nm to about 500 nm, about 5 nm to about 1 μm, about 10 nm to about 20 nm, about 10 nm to about 50 nm, about 10 nm to about 100 nm, about 10 nm to about 200 nm, about 10 nm to about 300 nm, about 10 nm to about 400 nm, about 10 nm to about 500 nm, about 10 nm to about 1 μm, about 20 nm to about 50 nm, about 20 nm to about 100 nm, about 20 nm to about 200 nm, about 20 nm to about 500 nm, about 20 nm to about 1 μm, about 50 nm to about 100 nm, about 50 nm to about 200 nm, about 50 nm to about 300 nm, about 50 nm to about 400 nm, about 50 nm to about 500 nm, about 50 nm to about 1 μm, about 100 nm to about 200 nm, about 100 nm to about 300 nm, about 100 nm to about 400 nm, about 100 nm to about 500 nm, about 100 nm to about 1 μm, about 200 nm to about 500 nm, about 200 nm to about 1 μm, or about 500 nm to about 1 μm.

In some embodiments, a plurality of nanoparticles comprises nanoparticles (e.g., nanocrystals) of relatively high quality (e.g., low defect density). For example, the nanoparticles may have a relatively low density of vacancy defects, substitution defects, topological defects, line defects (e.g., edge dislocation), surface defects (e.g., grain boundary mismatch), and/or any other type of defects. This may be advantageous in some cases, as the presence of defects in the nanoparticles may deleteriously affect charge carrier dynamics and/or absorption properties of the nanoparticles. In some embodiments, the percentage of nanoparticles having one or more defects is about 30% or less, about 20% or less, about 15% or less, about 10% or less, about 5% or less, about 2% or less, or about 1% or less. In some embodiments, the percentage of nanoparticles having one or more defects is in the range of about 1% to about 2%, about 1% to about 5%, about 1% to about 10%, about 1% to about 15%, about 1% to about 20%, about 1% to about 30%, about 2% to about 5%, about 2% to about 10%, about 2% to about 15%, about 2% to about 20%, about 2% to about 30%, about 5% to about 10%, about 5% to about 15%, about 5% to about 20%, about 5% to about 30%, about 10% to about 20%, or about 10% to about 30%.

Some aspects are directed to methods of making relatively large, monodisperse nanoparticles. In some embodiments, the method comprises an initial phase that results in formation of nanoparticles comprising at least a first element and a second element. According to some embodiments, nanoparticle formation (e.g., nucleation) is initiated by injecting a first precursor solution comprising the first element into a second precursor solution comprising the second element to form a mixed precursor solution, where the molar ratio of the first element to the second element in the mixed precursor solution is above a nucleation threshold. In some cases, the molar ratio of the first element to the second element in the mixed precursor solution is relatively low (e.g., the molar ratio of the second element to the first element in the mixed precursor solution is relatively high), which may result in substantially all of the first element being consumed during the nucleation process. In some embodiments, the method further comprises one or more additional phases resulting in growth of the nanoparticles formed during the initial phase. In certain cases, at least one step of the one or more additional phases comprises adding an amount of the first precursor solution into the mixed precursor solution, where the molar ratio of the first element to the second element in the mixed precursor solution (e.g., the ratio of the number of moles of the first element to the number of moles of the second element not bound to a nanoparticle) is lower than the nucleation threshold. In some cases, maintaining the concentration of the first element and/or the second element in the mixed precursor solution such that the molar ratio of the first element to the second element does not exceed the nucleation threshold may suppress nucleation and substantially confine nanoparticle formation to the initial phase. In some embodiments, confining nanoparticle formation to the initial phase may result in synthesis of a plurality of relatively monodisperse nanoparticles (e.g., uncontrollable nucleation may be suppressed). Instead of forming nanoparticles, the one or more additional phases may, in some cases, result in growth of the nanoparticles formed during the initial phase, such that relatively large nanoparticles may be formed.

In certain embodiments, the methods described herein may be conducted under relatively mild conditions. For example, in some cases, the methods may comprise steps conducted at relatively low temperatures. In some embodiments, the methods may comprise steps that have relatively short growth times. The use of relatively mild conditions may be advantageous in some cases, as it may reduce the number of defects present in the plurality of synthesized nanoparticles.

According to some embodiments, the method comprises the step of forming a first precursor solution. In certain cases, the first precursor solution comprises a first element present in the nanoparticles. Non-limiting examples of the first element include sulfur, selenium, and tellurium. In some cases, the first precursor solution may be prepared by dissolving a first compound comprising the first element in a first solvent. Examples of the first compound include, but are not limited to, bis(trimethylsilyl)sulfide [$((CH_3)_3Si)_2S$] (sometimes referred to as "TMS"), bis(trialkylsilyl)sulfide, elemental sulfur, dialkyl thioureas, thioacetamide, dimethylthioformamide, alkylthiols, alkyldisulfides, hydrogen sulfide, elemental selenium, selenium dioxide, selenourea, selenium disulfide, hydrogen selenide, bis(trimethylsilyl) selenide, elemental tellurium, tellurium dioxide, tellurium sulfide, hydrogen telluride, bis(trimethylsilyl)telluride, and bis(trialkylsilyl)telluride. The first solvent may comprise any solvent capable of solvating the first compound. Non-limiting examples of suitable solvents include trialkyl phosphine, n-alkyl amine, trialkyl amine, octadecene, and oleic acid.

In some embodiments, the method further comprises the step of forming a second precursor solution. In certain cases, the second precursor solution comprises a second element present in the nanoparticles. Suitable examples of the second element include, but are not limited to, lead, silver, mercury, cadmium, copper, bismuth, zinc, indium, gallium, aluminum, magnesium, and iron. According to some embodiments, the second precursor solution may be prepared by dissolving a second compound comprising the second element in a second solvent. Non-limiting examples of the second compound comprising the second element include lead oxide, lead acetate, lead acetylacetonate, lead nitrate, lead chloride, lead iodide, lead bromide, lead sulfate, lead tantalite, lead titanate, lead chromate, mercuric acetate, mercuric bromide, mercuric carbonate, mercuric chloride, mercuric fluorate, mercuric iodide, mercuric nitrate, mercuric oxide, mercuric sulfate, cadmium fluoride, cadmium carbonate, cadmium oxide, cadmium iodide, cadmium bromide, cadmium hydroxide, cadmium formate, cadmium chloride, cadmium tungstate, cadmium nitrate, cadmium salts, cadmium selenide, cadmium sulfide, cadmium telluride, copper fluoride, copper oxide, copper bromide, copper sulfide, copper hydroxide, copper carbonate, copper oxalate, zinc stearate, zinc sulfide, zinc carbonate, zinc selenite, zinc iodide, zinc oxide, zinc fluoride, zinc bromide, zinc peroxide, elemental indium, indium chloride, indium sulfate, indium sulfamate, indium trifluoride, indium fluoride, indium acetate, indium oxide-tin oxide, indium salts, indium sulfide, indium (III) iodide, indium nitrate, indium oxide, indium tribromide, indium hydroxide, gallium salts, gallium trichloride, gallium, gallium phosphide, gallium sesquioxide, gallium selenide, gallium chloride, alumina, alumina trihydrate (aluminum hydroxide), aluminum phosphate, aluminum bromide, aluminum chloride, alumino-silicate, aluminum oxide, aluminum fluoride, aluminum titanate, aluminum chloride, aluminum silicate, magnesium oxide, magnesium hydroxide, magnesium fluoride, magnesium titanate, magnesium bromide, magnesium silicate, magnesium-aluminum oxide, magnesium zirconate, magnesium stearate, magnesium aluminum silicate, iron oxides, iron fluoride, iron sulfide, and iron powder. The second solvent may comprise any solvent capable of solvating the second compound. Non-limiting examples of suitable solvents include trialkyl phosphine, n-alkyl amine, trialkyl amine, octadecene, oleic acid, and any combination thereof. In certain embodiments, the second solvent comprises octadecene and oleic acid.

In certain embodiments, the method further comprises the step of stirring the second precursor solution for a first period of time at a first temperature. For example, the first period of time may be about 50 minutes or less, about 30 minutes or less, about 20 minutes or less, about 15 minutes or less, about 10 minutes or less, about 5 minutes or less, about 1 minute or less, about 30 seconds or less, about 10 seconds or less, about 5 seconds or less, or about 1 second or less. In some embodiments, the first period of time is about 1 second or more, about 5 seconds or more, about 10 seconds or more, about 30 seconds or more, about 1 minute or more, about 5 minutes or more, about 10 minutes or more, about 15 minutes or more, about 20 minutes or more, about 30 minutes or more, or about 50 minutes or more. In some cases, the first period of time is in the range of about 1 s to about 10 s, about 1 s to about 30 s, about 1 s to about 1 min, about 1 s to about 5 min, about 1 s to about 10 min, about 1 s to about 15 min, about 1 s to about 20 min, about 1 s to about 30 min, about 1 s to about 50 min, about 10 s to about 30 s, about 10 s to about 1 min, about 10 s to about 5 min, about 10 s to about 10 min, about 10 s to about 15 min, about 10 s to about 20 min, about 10 s to about 30 min, about 10 s to about 50 min, about 30 s to about 1 min, about 30 s to about 5 min, about 30 s to about 10 min, about 30 s to about 15 min, about 30 s to about 20 min, about 30 s to about 30 min, about 30 s to about 50 min, about 1 min to about 5 min, about 1 min to about 10 min, about 1 min to about 15 min, about 1 min to about 20 min, about 1 min to about 30 min, about 1 min to about 50 min, about 5 min to about 30 min, about 5 min to about 50 min, about 10 min to about 30 min, or about 10 min to about 50 min. In some embodiments, the first temperature is relatively low. In certain cases, the first temperature is about 180° C. or less, about 150° C. or less, about 120° C. or less, about 110° C. or less, about 100° C. or less, about 90° C. or less, about 70° C. or less, about 50° C. or less, about 30° C. or less, or about 10° C. or less. In some embodiments, the first temperature is in the range of about 10° C. to about 50° C., about 10° C. to about 70° C., about 10° C. to about 90° C., about 10° C. to about 100° C., about 10° C. to about 110° C., about 10° C. to about 120° C., about 10° C. to about 150° C., about 10° C. to about 180° C., about 30° C. to about 70° C., about 30° C. to about 90° C., about 30° C. to about 100° C., about 30° C. to about 110° C., about 30° C. to about 120° C., about 30° C. to about 150° C., about 30° C. to about 180° C., about 50° C. to about 90° C., about 50° C. to about 100° C., about 50° C. to about 110° C., about 50° C. to about 120° C., about 50° C. to about 150° C., about 50° C. to about 180° C., about 70° C. to about 100° C., about 70° C. to about 110° C., about 70° C. to about 120° C., about 70° C. to about 150° C., about 70° C. to about 180° C., about 90° C. to about 110° C., about 90° C. to about 120° C., about 90° C. to about 150° C., about 90° C. to about 180° C., about 100° C. to about 110° C., about 100° C. to about 120° C., about 100° C. to about 150° C., about 100° C. to about 180° C., about 120° C. to about 150° C., about 120° C. to about 180° C., about 140° C. to about 150° C., about 140° C. to about 180° C., or about 160° C. to about 180° C.

In some embodiments, the method optionally comprises the step of changing the temperature of the second precursor solution from the first temperature to a second temperature after stirring the second precursor solution at the first temperature for the first amount of time. In some embodiments, the second temperature is about 180° C. or less, about 150° C. or less, about 120° C. or less, about 110° C. or less, about 100° C. or less, about 90° C. or less, about 70° C. or less, about 50° C. or less, about 30° C. or less, or about 10° C. or less. In some embodiments, the second temperature is in the range of about 10° C. to about 50° C., about 10° C. to about 70° C., about 10° C. to about 90° C., about 10° C. to about 100° C., about 10° C. to about 110° C., about 10° C. to about 120° C., about 10° C. to about 150° C., about 10° C. to about 180° C., about 30° C. to about 70° C., about 30° C. to about 90° C., about 30° C. to about 100° C., about 30° C. to about 110° C., about 30° C. to about 120° C., about 30° C. to about 150° C., about 30° C. to about 180° C., about 50° C. to about 90° C., about 50° C. to about 100° C., about 50° C. to about 110° C., about 50° C. to about 120° C., about 50° C. to about 150° C., about 50° C. to about 180° C., about 70° C. to about 100° C., about 70° C. to about 110° C., about 70° C. to about 120° C., about 70° C. to about 150° C., about 70° C. to about 180° C., about 90° C. to about 110° C., about 90° C. to about 120° C., about 90° C. to about 150° C., about 90° C. to about 180° C., about 100° C. to about 110° C., about 100° C. to about 120° C., about 100° C. to about 150° C., about 100° C. to about 180° C., about 120° C. to about 150° C., about 120° C. to about 180° C., about 140° C. to about 150° C., about 140° C. to about 180° C., or about 160° C. to about 180° C. The temperature of the second precursor solution may be changed according to any method known in the art (e.g., hot plate, Bunsen burner, oven, ice bath).

According to some embodiments, the method comprises injecting a first amount of the first precursor solution into the second precursor solution to form an initial mixed precursor solution. It has been recognized that it may be advantageous, in some embodiments, for the molar ratio of the first element to the second element in the initial mixed precursor solution to exceed a nucleation threshold (e.g., the molar ratio of the first element to the second element above which nucleation begins), thereby resulting in the formation of nanoparticles comprising the first and second elements. The nucleation threshold may be determined according to any method known in the art. For example, for a given amount of the second element (e.g., in the second precursor solution), varying amounts of the first element (e.g., in the first precursor solution) may be injected, and the nucleation threshold may be identified as the molar ratio at which nanoparticles begin to nucleate. In some embodiments, the nucleation threshold is at least about 1:20, at least about 1:15, at least about 1:10, at least about 1:8, at least about 1:5, at least about 1:4, at least about 1:3, at least about 1:2, or at least about 1:1. In some embodiments, the nucleation threshold is about 1:1 or less, about 1:2 or less, about 1:3 or less, about 1:4 or less, about 1:5 or less, about 1:8 or less, about 1:10 or less, about 1:15 or less, or about 1:20 or less. In certain cases, the nucleation threshold is in the range of about 1:20 to about 1:15, about 1:20 to about 1:10, about 1:20 to about 1:8, about 1:20 to about 1:5, about 1:20 to about 1:4, about 1:20 to about 1:3, about 1:20 to about 1:2, about 1:20 to about 1:1, about 1:15 to about 1:10, about 1:15 to about 1:8, about 1:15 to about 1:5, about 1:15 to about 1:4, about 1:15 to about 1:3, about 1:15 to about 1:2, about 1:15 to about 1:1, about 1:10 to about 1:8, about 1:10 to about 1:5, about 1:10 to about 1:4, about 1:10 to about 1:3, about 1:10 to about 1:2, about 1:10 to about 1:1, about 1:8 to about 1:5, about 1:8 to about 1:4, about 1:8 to about 1:3, about 1:8 to about 1:2, about 1:8 to about 1:1, about 1:5 to about 1:4, about 1:5 to about 1:3, about 1:5 to about 1:2, about 1:5 to about 1:1, about 1:4 to about 1:3, about 1:4 to about 1:2, about 1:4 to about 1:1, about 1:3 to about 1:2, about 1:3 to about 1:1, or about 1:2 to about 1:1. In some embodiments, the molar ratio of the first element to the second element in the initial mixed precursor solution is at least about 1:20, at least about 1:15, at least about 1:10, at least about 1:8, at least about 1:5, at least about 1:4, at least about 1:3, at least about 1:2, or at least about 1:1. In some embodiments, the molar ratio of the first element to the second element in the initial mixed precursor solution is in the range of about 1:20 to about 1:15, about 1:20 to about 1:10, about 1:20 to about 1:8, about 1:20 to about 1:5, about 1:20 to about 1:4, about 1:20 to about 1:3, about 1:20 to about 1:2, about 1:20 to about 1:1, about 1:10 to about 1:8, about 1:10 to about 1:5, about 1:10 to about 1:4, about 1:10 to about 1:3, about 1:10 to about 1:2, about 1:10 to about 1:1, about 1:5 to about 1:2, about 1:5 to about 1:1, about 1:4 to about 1:2, about 1:4 to about 1:1, about 1:3 to about 1:1, or about 1:2 to about 1:1.

It has also been recognized that it may be desirable, in some embodiments, for the concentration of the second element to exceed the concentration of the first element in the initial mixed precursor solution. For example, if the first element is substantially consumed during the initial nucleation process (e.g., the initial injection step), there may be an insufficient amount of the first element remaining to form additional nanoparticles. Accordingly, the formation of nanoparticles may be limited to the initial injection step. In some cases, it may be advantageous for substantially all the nanoparticles of a plurality of nanoparticles to be formed during the initial injection step, as growth of the nanoparticles may be more uniform than growth of nanoparticles formed during different steps (e.g., after multiple injections of the first precursor solution into the mixed precursor solution). In some embodiments, the molar ratio of the second element to the first element is at least about 1:1, at least about 2:1, at least about 3:1, at least about 4:1, at least about 5:1, at least about 8:1, at least about 10:1, at least about 15:1, or at least about 20:1. In some embodiments, the molar ratio of the second element to the first element is in the range of about 1:1 to about 2:1, about 1:1 to about 3:1, about 1:1 to about 4:1, about 1:1 to about 5:1, about 1:1 to about 8:1, about 1:1 to about 10:1, about 1:1 to about 15:1, about 1:1 to about 20:1, about 2:1 to about 5:1, about 2:1 to about 8:1, about 2:1 to about 10:1, about 2:1 to about 15:1, about 2:1 to about 20:1, about 5:1 to about 10:1, about 5:1 to about 15:1, about 5:1 to about 20:1, or about 10:1 to about 20:1.

In some embodiments, the initial mixed precursor solution further comprises a surfactant. Non-limiting examples of suitable surfactants include oleic acid, oleylamine, octylamine, octadecylamine, sodium dodecyl sulfate (SDS), polyvinyl pyrrolidone (PVP), glycerol, dioctyl sodium sulfosuccinate, cetyltrimethylammonium bromide, and diethyl sulfosuccinate. In some cases, the concentration of the surfactant may affect the rate of nucleation. For example, in certain cases, increasing the concentration of the surfactant may decrease the rate of nucleation.

In some embodiments, the method comprises stirring the initial mixed precursor solution for a second period of time at the second temperature. In certain cases, the second period of time is relatively short. The second period of time may, in some cases, be about 50 minutes or less, about 30 minutes or less, about 20 minutes or less, about 15 minutes or less, about 10 minutes or less, about 5 minutes or less, about 1 minute or less, about 30 seconds or less, about 10 seconds or less, about 5 seconds or less, or about 1 second or less. In some embodiments, the second period of time is in the range of about 1 s to about 10 s, about 1 s to about 30 s, about 1 s to about 1 min, about 1 s to about 5 min, about 1 s to about 10 min, about 1 s to about 15 min, about 1 s to about 20 min, about 1 s to about 30 min, about 1 s to about 50 min, about 10 s to about 30 s, about 10 s to about 1 min, about 10 s to about 5 min, about 10 s to about 10 min, about 10 s to about 15 min, about 10 s to about 20 min, about 10 s to about 30 min, about 10 s to about 50 min, about 30 s to about 1 min, about 30 s to about 5 min, about 30 s to about 10 min, about 30 s to about 15 min, about 30 s to about 20 min, about 30 s to about 30 min, about 30 s to about 50 min, about 1 min to about 5 min, about 1 min to about 10 min, about 1 min to about 15 min, about 1 min to about 20 min, about 1 min to about 30 min, about 1 min to about 50 min, about 5 min to about 30 min, about 5 min to about 50 min, about 10 min to about 30 min, or about 10 min to about 50 min.

In some cases, the method optionally comprises changing the temperature of the initial mixed precursor solution from the second temperature to a third temperature. In some embodiments, the third temperature is relatively low. The third temperature may be, in some cases, about 180° C. or less, about 150° C. or less, about 120° C. or less, about 110° C. or less, about 100° C. or less, about 90° C. or less, about 70° C. or less, about 50° C. or less, about 30° C. or less, or about 10° C. or less. In some embodiments, the third temperature is in the range of about 10° C. to about 50° C., about 10° C. to about 70° C., about 10° C. to about 90° C., about 10° C. to about 100° C., about 10° C. to about 110° C., about 10° C. to about 120° C., about 10° C. to about 150° C., about 10° C. to about 180° C., about 30° C. to about 70° C., about 30° C. to about 90° C., about 30° C. to about 100° C., about 30° C. to about 110° C., about 30° C. to about 120° C., about 30° C. to about 150° C., about 30° C. to about 180° C., about 50° C. to about 90° C., about 50° C. to about 100° C., about 50° C. to about 110° C., about 50° C. to about 120° C., about 50° C. to about 150° C., about 50° C. to about 180° C., about 70° C. to about 100° C., about 70° C. to about 110° C., about 70° C. to about 120° C., about 70° C. to about 150° C., about 70° C. to about 180° C., about 90° C. to about 110° C., about 90° C. to about 120° C., about 90° C. to about 150° C., about 90° C. to about 180° C., about 100° C. to about 110° C., about 100° C. to about 120° C., about 100° C. to about 150° C., about 100° C. to about 180° C., about 120° C. to about 150° C., about 120° C. to about 180° C., about 140° C. to about 150° C., about 140° C. to about 180° C., or about 160° C. to about 180° C. The temperature of the initial mixed precursor solution may be changed according to any method known in the art (e.g., hot plate, Bunsen burner, oven, ice bath).

According to some embodiments, the method further comprises one or more additional steps comprising injecting an amount of the first precursor solution into a mixed precursor solution (e.g., the initial mixed precursor solution). In some embodiments, the one or more additional injections comprise one injection, two injections, three injections, four injections, or five or more injections. In some cases, the molar ratio of the first element to the second element in the mixed precursor solution following at least one additional injection (e.g., of the first precursor solution) is less than the nucleation threshold. In some embodiments, the molar ratio of the first element to the second element in the mixed precursor solution following at least one additional injection (e.g., of the first precursor solution) is about 1:1 or less, about 1:2 or less, about 1:3 or less, about 1:4 or less, about 1:5 or less, about 1:8 or less, about 1:10 or less, about 1:15 or less, or about 1:20 or less. In certain embodiments, the molar ratio of the first element to the second element in the mixed precursor solution following at least one additional injection is in the range of about 1:20 to about 1:15, about 1:20 to about 1:10, about 1:20 to about 1:8, about 1:20 to about 1:5, about 1:20 to about 1:4, about 1:20 to about 1:3, about 1:20 to about 1:2, about 1:20 to about 1:1, about 1:10 to about 1:8, about 1:10 to about 1:5, about 1:10 to about 1:4, about 1:10 to about 1:3, about 1:10 to about 1:2, about 1:10 to about 1:1, about 1:5 to about 1:2, about 1:5 to about 1:1, about 1:4 to about 1:2, about 1:4 to about 1:1, about 1:3 to about 1:1, or about 1:2 to about 1:1.

It has been recognized that it may be advantageous, in certain cases, for the method to comprise one or more additional injection steps, where the molar ratio of the first element to the second element in the mixed precursor solution remains below the nucleation threshold, because such injection steps may result in growth of nanoparticles formed during the initial injection step. In some cases, maintaining the molar ratio of the first element to the second element below the nucleation threshold prevents the formation of additional nanoparticles following the additional injection steps, thereby confining nanoparticle formation to the initial injection step. In some cases, because substantially all the nanoparticles are formed during the initial injection step instead of during different steps (e.g., additional injection steps), a plurality of relatively monodisperse nanoparticles may be formed. In certain embodiments, the one or more additional injection steps may result in growth of the nanoparticles formed during the initial injection step, resulting in relatively large nanoparticles.

In some embodiments, the method further comprises stirring the mixed precursor solution after at least one of the one or more additional injection steps for a period of time. In certain embodiments, the method further comprises stirring the mixed precursor solution after each of the one or more additional injection steps for a period of time. In certain cases, the period of time is relatively short. The period of time the mixed precursor solution is stirred after an additional injection step may, in some cases, be about 50 minutes or less, about 30 minutes or less, about 20 minutes or less, about 15 minutes or less, about 10 minutes or less, about 5 minutes or less, about 1 minute or less, about 30 seconds or less, about 10 seconds or less, about 5 seconds or less, or about 1 second or less. In some embodiments, the period of time the mixed precursor solution is stirred after an additional injection step is in the range of about 1 s to about 10 s, about 1 s to about 30 s, about 1 s to about 1 min, about 1 s to about 5 min, about 1 s to about 10 min, about 1 s to about 15 min, about 1 s to about 20 min, about 1 s to about 30 min, about 1 s to about 50 min, about 10 s to about 30 s, about 10 s to about 1 min, about 10 s to about 5 min, about 10 s to about 10 min, about 10 s to about 15 min, about 10 s to about 20 min, about 10 s to about 30 min, about 10 s to about 50 min, about 30 s to about 1 min, about 30 s to about 5 min, about 30 s to about 10 min, about 30 s to about 15 min, about 30 s to about 20 min, about 30 s to about 30 min, about 30 s to about 50 min, about 1 min to about 5 min, about 1 min to about 10 min, about 1 min to about 15 min, about 1 min to about 20 min, about 1 min to about 30 min, about 1 min to about 50 min, about 5 min to about 30 min, about 5 min to about 50 min, about 10 min to about 30 min, or about 10 min to about 50 min. In embodiments where the mixed precursor solution is stirred after two or more additional injection steps, the periods of time the solution is stirred after different additional injection steps may be the same or different.

In some embodiments, the method optionally comprises changing the temperature of the mixed precursor solution after at least one of the one or more additional injection steps (e.g., after stirring for a period of time). In certain embodiments, the method optionally comprises changing the temperature of the mixed precursor solution after each of the one or more additional injection steps. In some embodiments, the temperature to which the mixed precursor solution is changed after an additional injection step is relatively low. The temperature may be, in some cases, about 180° C. or less, about 150° C. or less, about 120° C. or less, about 110° C. or less, about 100° C. or less, about 90° C. or less, about 70° C. or less, about 50° C. or less, about 30° C. or less, or about 10° C. or less. In some embodiments, the temperature to which the mixed precursor is changed after an additional injection step is in the range of about 10° C. to about 50° C., about 10° C. to about 70° C., about 10° C. to about 90° C., about 10° C. to about 100° C., about 10° C. to about 110° C., about 10° C. to about 120° C., about 10° C. to about 150° C., about 10° C. to about 180° C., about 30° C. to about 70° C., about 30° C. to about 90° C., about 30° C. to about 100° C., about 30° C. to about 110° C., about 30° C. to about 120° C., about 30° C. to about 150° C., about 30° C. to about 180° C., about 50° C. to about 90° C., about 50° C. to about 100° C., about 50° C. to about 110° C., about 50° C. to about 120° C., about 50° C. to about 150° C., about 50° C. to about 180° C., about 70° C. to about 100° C., about 70° C. to about 110° C., about 70° C. to about 120° C., about 70° C. to about 150° C., about 70° C. to about 180° C., about 90° C. to about 110° C., about 90° C. to about 120° C., about 90° C. to about 150° C., about 90° C. to about 180° C., about 100° C. to about 110° C., about 100° C. to about 120° C., about 100° C. to about 150° C., about 100° C. to about 180° C., about 120° C. to about 150° C., about 120° C. to about 180° C., about 140° C. to about 150° C., about 140° C. to about 180° C., or about 160° C. to about 180° C. The temperature of the mixed precursor solution may be changed according to any method known in the art (e.g., hot plate, Bunsen burner, oven, ice bath).

In some embodiments, the method further comprises adding a third solvent to the mixed precursor solution. The addition of the third solvent may, in some cases, isolate the nanoparticles. The third solvent may be any solvent that does not solvate the nanoparticles. Examples of suitable solvents include, but are not limited to, small alkyl chain alcohols (e.g., methanol, ethanol, propanol), ethyl acetate, dimethylformamide, acetonitrile, toluene, chloroform, and acetone.

It should be appreciated that although the methods have been described as comprising injection steps that involve adding the first precursor solution into the second precursor solution (and, subsequently, into mixed precursor solutions), the methods may instead comprise injection steps that involve adding the second precursor solution into the first precursor solution (and, subsequently, into mixed precursor solutions). In some such cases, it may be desirable for the concentration of the first element to exceed the concentration of the second element in the initial mixed precursor solution. For example, if the second element is substantially consumed during the initial nucleation process (e.g., the initial injection step), there may be an insufficient amount of the second element remaining to form additional nanoparticles, and nanoparticle formation may advantageously be limited to the initial injection step. In some embodiments, the molar ratio of the first element to the second element is at least about 1:1, at least about 2:1, at least about 3:1, at least about 4:1, at least about 5:1, at least about 8:1, at least about 10:1, at least about 15:1, or at least about 20:1. In some embodiments, the molar ratio of the first element to the second element is in the range of about 1:1 to about 2:1, about 1:1 to about 3:1, about 1:1 to about 4:1, about 1:1 to about 5:1, about 1:1 to about 8:1, about 1:1 to about 10:1, about 1:1 to about 15:1, about 1:1 to about 20:1, about 2:1 to about 5:1, about 2:1 to about 8:1, about 2:1 to about 10:1, about 2:1 to about 15:1, about 2:1 to about 20:1, about 5:1 to about 10:1, about 5:1 to about 15:1, about 5:1 to about 20:1, or about 10:1 to about 20:1.

The monodisperse nanoparticles described herein may, in some cases, be used in a device capable of absorbing IR radiation. Non-limiting examples of suitable devices include IR photodetectors, IR up-conversion devices, and IR solar cells. In some cases, the devices comprise a plurality of layers. The layers of the devices may, in certain embodiments, be characterized by a valence band (e.g., a highest occupied energy level) having a valence band energy (e.g., ionization potential) and a conduction band (e.g., a lowest unoccupied energy level) having a conduction band energy (e.g., electron affinity). In some cases, the layers of the devices may be deposited using spin-coating, spray-casting, inkjet printing, vacuum deposition (e.g., sputtering, chemical vapor deposition), and/or any other suitable deposition technique. In some embodiments, the nanoparticles may be mixed with one or more binders. Examples of suitable binders include, but are not limited to, 1,2-ethanedithiol (EDT), 1,2-benzenedithiol (1,2-BDT), 1,3-benzenedithiol (1,3-BDT), 1,4-benzenedithiol (1,4-BDT), 3-mercaptopropionic acid (MPA), 1,2-ethylenediamine (EDA), ammonium thiocyanate (SCN), tetrabutylammonium iodide (TBAI), tetrabutylammonium bromide (TBABr), tetrabutylammonium chloride (TBACl), and tetrabutylammonium fluoride (TBAF).

In some embodiments, the IR-absorbing device is an IR photodetector. An IR photodetector generally refers to a device capable of absorbing IR radiation and generating a response (e.g., current flow). In some embodiments, an IR photodetector comprises an anode, a cathode, and an IR-absorbing layer comprising the monodisperse nanoparticles described herein. The monodisperse nanoparticles may be capable of absorbing IR radiation and generating electron-hole pairs. In some embodiments, holes may be transported in a first direction (e.g., towards the anode), and electrons may be transported in a second, substantially opposite direction (e.g., towards the cathode). In certain embodiments, the monodisperse, IR-absorbing nanoparticle layer may allow the IR photodetector to selectively detect radiation at a particular wavelength.

According to some embodiments, the IR photodetector has a standard, or regular, architecture. An exemplary schematic illustration of an IR photodetector having a standard architecture is shown in FIG. 1. In FIG. 1, IR photodetector 100 is a multi-layered structure comprising substrate 102, anode 104, optional electron blocking layer 106, monodisperse, IR-absorbing nanoparticle layer 108, optional hole blocking layer 110, and cathode 112. As shown in FIG. 1, anode 104 may be positioned adjacent substrate 102, and optional electron blocking layer 106 may be positioned adjacent anode 104. Cathode 112 may be positioned on the opposite end of IR photodetector 100, and optional hole blocking layer 110 may be positioned adjacent cathode 112. Monodisperse, IR-absorbing nanoparticle layer 108 may be positioned between optional electron blocking layer 106, on a first side, and optional hole blocking layer 110, on a second, substantially opposite side. As used herein, when a layer is referred to as being "on," "on top of," or "adjacent" another layer, it can be directly on, on top of, or adjacent the layer, or an intervening layer may also be present. A layer that is "directly on," "directly adjacent," or "in contact with" another layer means that no intervening layer is present. Likewise, a layer that is positioned "between" two layers may be directly between the two layers such that no intervening layer is present, or an intervening layer may be present.

In operation, a reverse bias voltage may be applied to photodetector 100. IR radiation may enter photodetector 100 through substrate 102 and pass through anode 104 and optional electron blocking layer 106. The IR radiation may then excite electrons in monodisperse, IR-absorbing nanoparticle layer 108, resulting in the generation of electron-hole pairs (e.g., excitons). The electrons may be transported through optional hole blocking layer 110 to cathode 112, while the holes may be transported through optional electron blocking layer 106 to anode 104, thereby producing a measureable photocurrent.

In some embodiments, the reverse bias voltage applied to the photodetector may be relatively low. In some cases, the magnitude of the reverse bias voltage may be about 10 V or less, about 5 V or less, about 4 V or less, about 3 V or less, about 2 V or less, or about 1 V or less. In some embodiments, the magnitude of the reverse bias voltage may be in the range of about 0 V to about 1 V, about 0 V to about 2 V, about 0 V to about 3 V, about 0 V to about 4 V, about 0 V to about 5 V, about 0 V to about 10 V, about 1 V to about 2 V, about 1 V to about 3 V, about 1 V to about 4 V, about 1 V to about 5 V, about 1 V to about 10 V, about 2 V to about 3 V, about 2 V to about 4 V, about 2 V to about 5 V, about 2 V to about 10 V, or about 5 V to about 10 V.

As shown in FIG. 1, IR photodetector 100 may optionally comprise hole blocking layer 110. A hole blocking layer (HBL) generally refers to a layer that inhibits transport of holes between two or more layers of a device. In some cases, it may be advantageous to inhibit transport of holes from one layer to another because inhibiting such transport may reduce dark current (e.g., current that flows through a device in the absence of IR absorption by the monodisperse nanoparticle layer). For example, reducing dark current may result in enhanced performance characteristics (e.g., higher detectivity) of the IR photodetector.

In some cases, hole blocking layer 110 may inhibit transport of holes from cathode 112 to monodisperse, IR-absorbing nanoparticle layer 108 under reverse bias because there is a substantially large gap between the work function of cathode 112 and the valence band energy of hole blocking layer 110. For example, the magnitude of the difference between the work function of the cathode and the valence band energy of the hole blocking layer may be at least about 0.5 eV, at least about 1 eV, at least about 1.5 eV, at least about 2 eV, at least about 2.5 eV, at least about 3 eV, at least about 4 eV, or at least about 5 eV. In some cases, the magnitude of the difference between the work function of the cathode and the valence band energy of the hole blocking layer is in the range of about 0.5 eV to about 1 eV, about 0.5 eV to about 1.5 eV, about 0.5 eV to about 2 eV, about 0.5 eV to about 2.5 eV, about 0.5 eV to about 3 eV, about 0.5 eV to about 4 eV, about 0.5 eV to about 5 eV, about 1 eV to about 2 eV, about 1 eV to about 2.5 eV, about 1 eV to about 3 eV, about 1 eV to about 4 eV, about 1 eV to about 5 eV, about 1.5 eV to about 2.5 eV, about 1.5 eV to about 3 eV, about 1.5 eV to about 4 eV, about 1.5 eV to about 5 eV, about 2 eV to about 3 eV, about 2 eV to about 4 eV, or about 2 eV to about 5 eV.

In some embodiments, the valence band energy of the hole blocking layer is relatively high. For example, the magnitude of the valence band energy of the hole blocking layer may be at least about 5 eV, at least about 5.5 eV, at least about 6 eV, at least about 6.5 eV, at least about 7 eV, at least about 7.5 eV, at least about 8 eV, at least about 9 eV, or at least about 10 eV. In some cases, the magnitude of the valence band energy of the hole blocking layer is in the range of about 5 eV to about 6 eV, about 5 eV to about 7 eV, about 5 eV to about 8 eV, about 5 eV to about 9 eV, about 5 eV to about 10 eV, about 6 eV to about 7 eV, about 6 eV to about 8 eV, about 6 eV to about 9 eV, about 6 eV to about 10 eV, about 7 eV to about 8 eV, about 7 eV to about 9 eV, about 7 eV to about 10 eV, about 8 eV to about 9 eV, or about 8 eV to about 10 eV.

In certain embodiments, the hole blocking layer comprises an organic material. Non-limiting examples of suitable organic materials for the HBL include 2,9-dimethyl-4,7-diphenyl-1,10-phenanthroline (BCP), p-bis(triphenylsilyl) benzene (UGH2), 4,7-diphenyl-1,10-phenanthroline (BPhen), tris-(8-hydroxy quinolone) aluminum ($Alq_3$), 3,5'-N,N'-dicarbazole-benzene (mCP), $C_{60}$, and tris[3-(3-pyridyl)-mesityl]borane (3TPYMB). In some embodiments, the hole blocking layer comprises an inorganic material. Non-limiting examples of suitable inorganic materials for the HBL include zinc oxide (ZnO), titanium dioxide ($TiO_2$), silicon monoxide (SiO), silicon dioxide ($SiO_2$), silicon nitride ($Si_3N_4$), and alumina ($Al_2O_3$). In certain cases, the HBL comprises a layer of nanoparticles.

As shown in FIG. 1, IR photodetector 100 may optionally comprise electron blocking layer 106. An electron blocking layer (EBL) generally refers to a layer that inhibits transport of electrons between two or more layers of a device. In some cases, it may be advantageous to inhibit transport of electrons from one layer to another because inhibiting such transport may reduce dark current. As noted above, reducing dark current may advantageously improve certain performance characteristics of the IR photodetector.

In some cases, EBL 106 may inhibit transport of electrons from anode 104 to monodisperse, IR-absorbing nanoparticle layer 108 under reverse bias because there is a substantially large gap between the work function of anode 104 and the conduction band energy of electron blocking layer 108. For example, the magnitude of the difference between the work function of the anode and the conduction band energy of the electron blocking layer may be at least about 0.5 eV, at least about 1 eV, at least about 1.5 eV, at least about 2 eV, at least about 2.5 eV, at least about 3 eV, at least about 4 eV, or at least about 5 eV. In some cases, the magnitude of the difference between the work function of the anode and the conduction band energy of the electron blocking layer may be in the range of about 0.5 eV to about 1 eV, about 0.5 eV to about 1.5 eV, about 0.5 eV to about 2 eV, about 0.5 eV to about 2.5 eV, about 0.5 eV to about 3 eV, about 0.5 eV to about 4 eV, about 0.5 eV to about 5 eV, about 1 eV to about 2 eV, about 1 eV to about 2.5 eV, about 1 eV to about 3 eV, about 1 eV to about 4 eV, about 1 eV to about 5 eV, about 1.5 eV to about 2.5 eV, about 1.5 eV to about 3 eV, about 1.5 eV to about 4 eV, about 1.5 eV to about 5 eV, about 2 eV to about 3 eV, about 2 eV to about 4 eV, or about 2 eV to about 5 eV.

In certain embodiments, the conduction band energy of the electron blocking layer may be relatively low. In some cases, the magnitude of the conduction band energy of the electron blocking layer is about 3 eV or less, about 2.5 eV or less, about 2 eV or less, about 1.5 eV or less, about 1 eV or less, or about 0.5 eV or less. In some cases, the magnitude of the conduction band energy of the electron blocking layer is in the range of about 0.5 eV to about 1 eV, about 0.5 eV to about 1.5 eV, about 0.5 eV to about 2 eV, about 0.5 eV to about 2.5 eV, about 0.5 eV to about 3 eV, about 1 eV to about 1.5 eV, about 1 eV to about 2 eV, about 1 eV to about 2.5 eV, about 1 eV to about 3 eV, about 1.5 eV to about 2 eV, about 1.5 eV to about 2.5 eV, about 1.5 eV to about 3 eV, about 2 eV to about 2.5 eV, or about 2.5 eV to about 3 eV.

In some embodiments, the electron blocking layer comprises an organic material. Non-limiting examples of suitable organic materials for the EBL include 1,1-bis[(di-4-tolylamino)phenyl]cyclohexane (TAPC), N,N'-diphenyl-N,N'(2-naphthyl)-(1,1'-phenyl)-4,4'-diamine (NPB), N,N'-diphenyl-N,N'-di(m-tolyl)benzidine (TPD), poly(9,9-dioctyl-fluorene-co-N-(4-butylphenyl)diphenylamine) (TPB), poly-N,N-bis-4-butylphenyl-N,N-bis-phenylbenzidine (poly-TPD), and polystyrene-N,N-diphenyl-N,N-bis(4-n-butylphenyl)-(1,10-biphenyl)-4,4-diamine-perfluorocyclobutane (PS-TPD-PFCB). In some embodiments, the electron blocking layer comprises an inorganic material. Non-limiting examples of suitable inorganic materials for the EBL include NiO and CuO. In certain cases, the EBL comprises a layer of nanoparticles.

As shown in FIG. 1, IR photodetector 100 may have a standard architecture. In some embodiments, substrate 102 is sufficiently transparent to IR radiation to allow IR radiation to be detected by monodisperse, IR-absorbing nanoparticle layer 108. Examples of suitable materials for substrate 102 include, but are not limited to, glass, plastic, and quartz. As shown in FIG. 1, anode 104 may be positioned adjacent substrate 102. In some cases, anode 104 is also transparent to IR radiation. Non-limiting examples of suitable materials for the anode include indium tin oxide (ITO), indium zinc oxide (IZO), aluminum tin oxide (ATO), aluminum zinc oxide (AZO), any other suitable transparent conductive oxide, carbon nanotubes, silver nanowires, and combinations thereof. FIG. 1 also shows that IR photodetector 100 may comprise cathode 112. Cathode 112 may not necessarily be transparent to IR radiation. Examples of suitable materials for the cathode include, but are not limited to, Ca, Mg, Al, Ag, Au, Ti, W, LiF/Al, Ca:Mg, LiF/Al/ITO, Ag/ITO, CsCO$_3$/ITO, Ba/Al, and combinations thereof. In some embodiments, the cathode may be highly reflective.

Alternatively, in some embodiments, the IR photodetector has an inverted architecture (not shown). In an inverted architecture, the cathode may be positioned adjacent the substrate. Accordingly, in an IR photodetector having an inverted architecture, the cathode may be transparent to IR radiation. Non-limiting examples of suitable materials for the cathode include indium tin oxide (ITO), magnesium, calcium, aluminum, silver, and combinations thereof. Conversely, the anode may not necessarily be transparent to IR radiation. Non-limiting examples of suitable materials for the anode include gold, silver, platinum, magnesium, calcium, and combinations thereof, in addition to the anode materials listed above.

Those of ordinary skill in the art can readily identify appropriate combinations of anodes, cathodes, hole blocking layers, electron blocking layers, and other layers by their relative work functions, valence band energies, conduction band energies, layer compatibility, and the nature of any desired deposition methods used during their fabrication.

In some embodiments, the IR photodetectors described herein have properties that have been recognized as being advantageous. For example, the IR photodetectors may exhibit high specific detectivity, high responsivity, and/or high external quantum efficiency (EQE). Specific detectivity may generally refer to a figure of merit relating to the sensitivity of a photodetector, which it may be expressed using Equation 3:

$$D^* = \frac{R\sqrt{A}\sqrt{B}}{(2qI_d)^{1/2}} \quad (3)$$

where R is responsivity (e.g., a measure of electrical output, such as photocurrent, per optical input), A is device area, B is bandwidth, $I_d$ is dark current density, and q is elementary charge ($1.6 \times 10^{-19}$ C). In some embodiments, an IR photodetector has a specific detectivity of at least about $1 \times 10^{10}$ Jones, at least about $5 \times 10^{10}$ Jones, at least about $1 \times 10^{11}$ Jones, at least about $5 \times 10^{11}$ Jones, at least about $1 \times 10^{12}$ Jones, or at least about $1.2 \times 10^{12}$ Jones at a wavelength of at least about 700 nm, at least about 1000 nm, at least about 1200 nm, at least about 1500 nm, at least about 1800 nm, at least about 2000 nm, at least about 2500 nm, or at least about 3000 nm.

In some embodiments, an IR photodetector may have a relatively high responsivity. In certain cases, the IR photodetector has a responsivity of at least about 0.05 A/W, at least about 0.1 A/W, at least about 0.15 A/W, at least about 0.20 A/W, or at least about 0.21 A/W at a wavelength of at least about 700 nm, at least about 1000 nm, at least about 1200 nm, at least about 1500 nm, at least about 1800 nm, at least about 2000 nm, at least about 2500 nm, or at least about 3000 nm.

In some embodiments, an IR photodetector may have a relatively high external quantum efficiency (EQE). EQE generally refers to the ratio of the number of free charge carriers generated to the number of incident photons on the photodetector. In certain cases, the IR photodetector has an EQE of at least about 1%, at least about 2%, at least about 5%, at least about 6%, at least about 7%, at least about 8%, at least about 9%, at least about 10%, at least about 15%, at least about 20%, at least about 30%, at least about 40%, or at least about 50% at a wavelength of at least about 700 nm, at least about 1000 nm, at least about 1200 nm, at least about 1500 nm, at least about 1800 nm, at least about 2000 nm, at least about 2500 nm, or at least about 3000 nm.

In some embodiments, performance of the IR photodetector may be stable in air over relatively long periods of time. In certain cases, the specific detectivity, responsivity, and/or EQE of the photodetector at a wavelength of at least about 700 nm, at least about 1000 nm, at least about 1200 nm, at least about 1500 nm, at least about 1800 nm, at least about 2000 nm, at least about 2500 nm, or at least about 3000 nm may be stable (e.g., changing by no more than about 20% or less, about 10% or less, about 5% or less, or about 1% or less) over a period of at least about 1 day, at least about 10 days, at least about 30 days, at least about 60 days, at least about 90 days, or at least about 100 days.

In some embodiments, the IR-absorbing device is an IR up-conversion device. An IR up-conversion device generally refers to a device capable of absorbing IR radiation at a first wavelength and emitting radiation having a second, smaller wavelength (e.g., higher energy). For example, an IR-to-visible up-conversion device may absorb IR radiation and emit visible light. In some embodiments, the up-conversion device comprises an IR-absorbing layer comprising the monodisperse nanoparticles described herein and a light-emitting layer. In certain cases, the up-conversion device comprises an IR photodetector integrated with a light-emitting diode (LED) (e.g., an organic light-emitting diode (OLED)). In some embodiments, the LED may be a multi-layered structure comprising a light-emitting layer, a hole transport layer (HTL), and an electron transport layer (ETL). In certain embodiments, the up-conversion device may further comprise a hole blocking layer (HBL) and/or an electron blocking layer (EBL).

Figure 2:
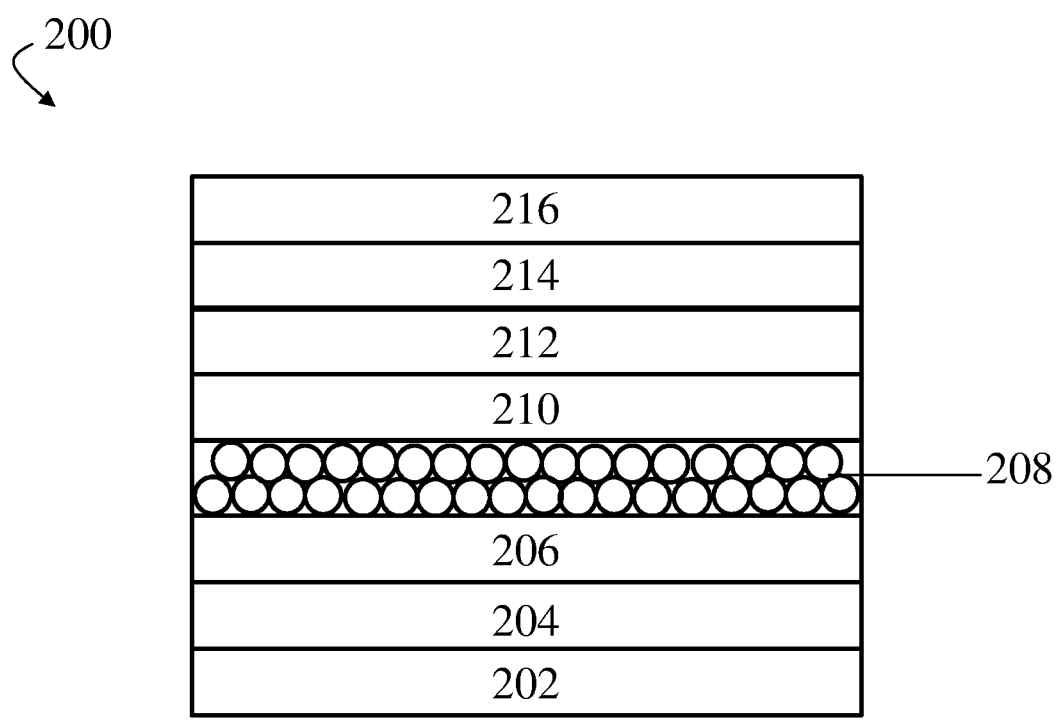
FIG. 2 shows, according to some embodiments, a cross-sectional schematic illustration of an IR up-conversion device.

FIG. 2 shows an exemplary schematic illustration of IR up-conversion device 200. IR up-conversion device 200 comprises substrate 202, anode 204, optional hole blocking layer 206, monodisperse, IR-absorbing nanoparticle layer 208, hole transport layer 210, light-emitting layer 212, electron transport layer 214, and cathode 216. As shown in FIG. 2, anode 204 may be positioned adjacent substrate 202, and optional hole blocking layer 206 may be positioned adjacent anode 204. A first side of monodisperse, IR-absorbing nanoparticle layer 208 may be positioned adjacent optional hole blocking layer 206. A second, substantially opposite side of nanoparticle layer 208 may be positioned adjacent an LED (e.g., an OLED) comprising light-emitting layer 212 positioned between hole transport layer 210 and electron transport layer 214. In particular, nanoparticle layer 208 may be positioned adjacent hole transport layer 210. Electron transport layer 214 may be positioned adjacent cathode 216.

In operation, a potential may be applied between anode 204 and cathode 216. IR radiation incident on substrate 202 may pass through anode 204 and optional hole blocking layer 206 to monodisperse, IR-absorbing nanoparticle layer 208, which may generate electron-hole pairs. Holes may be transported through hole transport layer 210 to light-emitting layer 212, where holes may combine with electrons injected from cathode 216 and passing through electron transport layer 214. As the holes and electrons combine, light-emitting layer 212 may emit visible light.

As shown in FIG. 2, IR up-conversion device 200 may comprise light-emitting layer 212. In some embodiments, the light-emitting layer may emit visible light (e.g., electromagnetic radiation having a wavelength between about 400 nm and about 700 nm). The light-emitting layer may emit light in any portion of the visible spectrum (e.g., substantially red light, substantially green light, substantially blue light). Non-limiting examples of suitable materials for the light-emitting layer include $Alq_3$; fac-tris(2-phenylpyridinato)iridium(III) ("Ir(ppy)$_3$"); iridium (III) bis[(4,6-di-fluorophenyl)-pyridinate-N,C2']picolinate ("FIrpic"); 3,5'-N,N'-dicarbazole-benzene ("mCP") doped with tris(2-phenylisoquinoline)iridium ("Ir(piq)$_3$"); mCP doped with Ir(ppy)$_3$; mCP: FIrpic; tra-(2-phenylpyridine) iridium; and poly-[2-methoxy-5-(2'-ethyl-hexyloxy) phenylene vinylene] ("MEH-PPV").

In some embodiments, IR up-conversion device 200 comprises hole transport layer (HTL) 210. A hole transport layer (HTL) generally refers to a layer that facilitates hole transport between two or more layers of a device. In some embodiments, the HTL comprises an organic material. Non-limiting examples of suitable organic materials for the HTL include 1,1-bis[(di-4-tolylamino)phenyl]cyclohexane (TAPC), N,N'-diphenyl-N,N'(2-naphthyl)-(1,1'-phenyl)-4,4'-diamine (NPB), and N,N'-diphenyl-N,N'-di(m-tolyl)benzidine (TPD).

In some cases, HTL 210 facilitates transport of holes from monodisperse, IR-absorbing nanoparticle layer 208 to light-emitting layer 212. HTL 210 may facilitate transport of holes from monodisperse, IR-absorbing nanoparticle layer 208 because the valence band energy of HTL 210 is substantially aligned with the valence band energy of monodisperse, IR-absorbing nanoparticle layer 208. For example, in certain embodiments, the magnitude of the difference between the valence band energy of HTL 210 and the valence band energy of monodisperse, IR-absorbing nanoparticle layer 208 is about 1 eV or less, about 0.8 eV or less, about 0.6 eV or less, about 0.5 eV or less, about 0.4 eV or less, about 0.3 eV or less, about 0.25 eV or less, about 0.2 eV or less, about 0.15 eV or less, about 0.1 eV or less, or about 0.05 eV or less. In some cases, the magnitude of the difference between the valence band energy of HTL 210 and the valence band energy of monodisperse, IR-absorbing nanoparticle layer 208 is in the range of about 0.05 eV to about 0.1 eV, about 0.05 eV to about 0.2 eV, about 0.05 eV to about 0.3 eV, about 0.05 eV to about 0.4 eV, about 0.05 eV to about 0.5 eV, about 0.05 eV to about 1 eV, about 0.1 eV to about 0.2 eV, about 0.1 eV to about 0.3 eV, about 0.1 eV to about 0.4 eV, about 0.1 eV to about 0.5 eV, about 0.1 eV to about 1 eV, about 0.2 eV to about 0.3 eV, about 0.2 eV to about 0.4 eV, about 0.2 eV to about 0.5 eV, or about 0.2 eV to about 1 eV.

In some cases, hole transport layer 210 may facilitate transport of holes to light-emitting layer 212 because the valence band energy of HTL 210 is substantially aligned with the valence band energy of light-emitting layer 212. For example, the magnitude of the difference between the valence band energy of HTL 210 and the valence band energy of light-emitting layer 212 may be about 1 eV or less, about 0.8 eV or less, about 0.6 eV or less, about 0.5 eV or less, about 0.4 eV or less, about 0.3 eV or less, about 0.25 eV or less, about 0.2 eV or less, about 0.15 eV or less, about 0.1 eV or less, or about 0.05 eV or less. In some cases, the magnitude of the difference between the valence band energy of HTL 210 and the valence band energy of light-emitting layer 212 is in the range of about 0.05 eV to about 0.1 eV, about 0.05 eV to about 0.2 eV, about 0.05 eV to about 0.3 eV, about 0.05 eV to about 0.4 eV, about 0.05 eV to about 0.5 eV, about 0.05 eV to about 1 eV, about 0.1 eV to about 0.2 eV, about 0.1 eV to about 0.3 eV, about 0.1 eV to about 0.4 eV, about 0.1 eV to about 0.5 eV, about 0.1 eV to about 1 eV, about 0.2 eV to about 0.3 eV, about 0.2 eV to about 0.4 eV, about 0.2 eV to about 0.5 eV, or about 0.2 eV to about 1 eV.

In some embodiments, IR up-conversion device 200 comprises electron transport layer (ETL) 214. An electron transport layer generally refers to a layer that facilitates electron transport between two or more layers of a device. In some embodiments, the ETL comprises an organic material. Non-limiting examples of suitable organic materials include tris[3-(3-pyridyl)-mesityl]borane (3TPYMB), 2,9-dimethyl-4,7-diphenyl-1,10-phenanthroline (BCP), 4,7-diphenyl-1,10-phenanthroline (BPhen), and tris-(8-hydroxy quinoline) aluminum ($Alq_3$).

In some cases, ETL 214 facilitates transport of electrons from cathode 216 to light-emitting layer 212. ETL 214 may facilitate transport of electrons from cathode 216 because the conduction band energy of ETL 214 is substantially aligned with the work function of cathode 216. For example, the magnitude of the difference between the work function of cathode 216 and the conduction band energy of ETL 214 may be about 1 eV or less, about 0.8 eV or less, about 0.6 eV or less, about 0.5 eV or less, about 0.4 eV or less, about 0.3 eV or less, about 0.25 eV or less, about 0.2 eV or less, about 0.15 eV or less, about 0.1 eV or less, or about 0.05 eV or less. In some cases, the magnitude of the difference between the work function of cathode 216 and the conduction band energy of ETL 214 may be in the range of about 0.05 eV to about 0.1 eV, about 0.05 eV to about 0.2 eV, about 0.05 eV to about 0.3 eV, about 0.05 eV to about 0.4 eV, about 0.05 eV to about 0.5 eV, about 0.05 eV to about 1 eV, about 0.1 eV to about 0.2 eV, about 0.1 eV to about 0.3 eV, about 0.1 eV to about 0.4 eV, about 0.1 eV to about 0.5 eV, about 0.1 eV to about 1 eV, about 0.2 eV to about 0.3 eV, about 0.2 eV to about 0.4 eV, about 0.2 eV to about 0.5 eV, or about 0.2 eV to about 1 eV.

In some embodiments, ETL 214 may facilitate electron transport to light-emitting layer 212 because the conduction band energy of ETL 214 is substantially aligned with the conduction band energy of light-emitting layer 212. For example, in certain cases, the magnitude of the difference between the conduction band energy of light-emitting layer 212 and the conduction band energy of ETL 214 may be about 1 eV or less, about 0.8 eV or less, about 0.6 eV or less, about 0.5 eV or less, about 0.4 eV or less, about 0.3 eV or less, about 0.25 eV or less, about 0.2 eV or less, about 0.15 eV or less, about 0.1 eV or less, or about 0.05 eV or less. In some cases, the magnitude of the difference between the conduction band energy of light-emitting layer 212 and the conduction band energy of ETL 214 may be in the range of about 0.05 eV to about 0.1 eV, about 0.05 eV to about 0.2 eV, about 0.05 eV to about 0.3 eV, about 0.05 eV to about 0.4 eV, about 0.05 eV to about 0.5 eV, about 0.05 eV to about 1 eV, about 0.1 eV to about 0.2 eV, about 0.1 eV to about 0.3 eV, about 0.1 eV to about 0.4 eV, about 0.1 eV to about 0.5 eV, about 0.1 eV to about 1 eV, about 0.2 eV to about 0.3 eV, about 0.2 eV to about 0.4 eV, about 0.2 eV to about 0.5 eV, or about 0.2 eV to about 1 eV.

In some embodiments, the IR up-conversion device may further comprise an anode, a cathode, a hole blocking layer, an electron blocking layer, and/or a substrate. One of ordinary skill in the art would be able to identify appropriate materials for each layer based on the above disclosure. Additionally, it is noted that while FIG. 2 shows IR up-conversion device 200 having a standard architecture, the IR up-conversion device may instead have an inverted architecture in which the cathode is positioned adjacent the substrate.

In some embodiments, the IR-absorbing device is an IR solar cell (e.g., an IR photovoltaic cell). An IR solar cell generally refers to a device capable of absorbing IR radiation (e.g., IR radiation emitted by the sun) and generating electricity. In some embodiments, an IR solar cell comprises an anode, a cathode, and an IR-absorbing layer comprising the monodisperse nanoparticles described herein. In addition, the IR solar cell may further comprise an electron extraction layer and/or a hole extraction layer.

Figure 3:
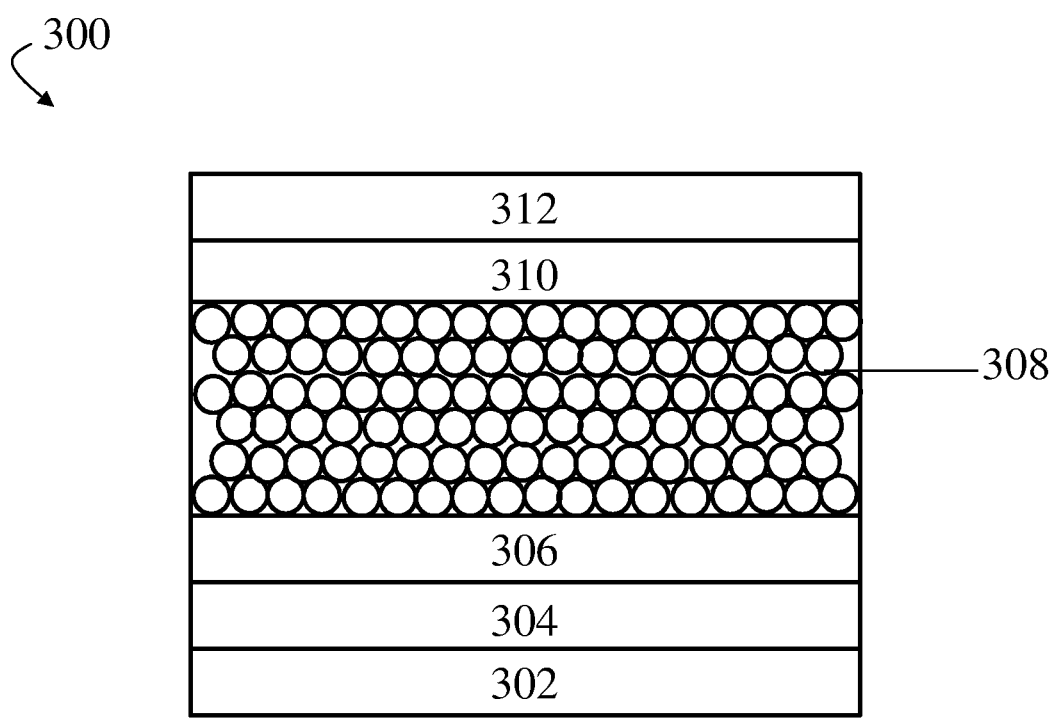
FIG. 3 shows, according to some embodiments, a cross-sectional schematic illustration of an IR solar cell.

FIG. 3 shows an exemplary schematic illustration of IR solar cell 300. As shown in FIG. 3, IR solar cell 300 comprises substrate 302, anode 304, optional hole extraction layer 306, monodisperse, IR-absorbing nanoparticle layer 308, optional electron extraction layer 310, and cathode 312. As shown in FIG. 3, anode 304 may be positioned adjacent substrate 302, and optional hole extraction layer 306 may be positioned adjacent anode 304. Cathode 312 may be positioned on the opposite end of IR solar cell 300, and optional electron extraction layer 310 may be positioned adjacent cathode 312. Monodisperse, IR-absorbing nanoparticle layer 308 may be positioned between optional hole extraction layer 306, on a first side, and optional electron extraction layer 310, on a second, substantially opposite side.

IR solar cell 300 may be operated under a forward bias voltage or no external bias voltage. In operation, IR radiation may enter IR solar cell 300 through substrate 302 and pass through anode 304 and optional hole extraction layer 306. The IR radiation may then excite electrons in monodisperse, IR-absorbing nanoparticle layer 308, resulting in the generation of electron-hole pairs. The holes may be transported through optional hole extracting layer 306 to anode 304, and the electrons may be transported through optional electron extracting layer 310 to cathode 312 to produce an electric current.

In some embodiments, the IR solar cell comprises a hole extraction layer. For example, in IR solar cell 300, hole extraction layer 306 may facilitate transport of holes from monodisperse, IR-absorbing nanoparticle layer 308 to anode 304. In certain embodiments, the hole extraction layer comprises a highly n-type material. An n-type material generally refers to a material having a higher concentration of electrons than holes (e.g., the Fermi level lies closer to the conduction band than the valence band). In some cases, the hole extraction layer may have a large work function (e.g., a work function substantially aligned with the work function of anode 304). Non-limiting examples of suitable materials for the hole extraction layer include molybdenum oxide ($MoO_3$), tungsten oxide ($WO_3$), and vanadium oxide ($V_2O_5$).

In some embodiments, the IR solar cell comprises an electron extraction layer. For example, in IR solar cell 300, electron extraction layer 310 may facilitate transport of electrons from monodisperse, IR-absorbing nanoparticle layer 308 to cathode 312. Examples of suitable materials for the electron extraction layer include, but are not limited to, titanium dioxide ($TiO_2$), zinc oxide (ZnO), lithium fluoride (LiF), lithium cobalt oxide ($LiCoO_2$), cesium fluoride (CsF), cesium carbonate ($Cs_2CO_3$), niobium pentoxide ($Nb_2O_5$), carbon nanotubes (CNTs), zinc tin oxide (ZTO), and polyethylene oxide (PEO).

In some embodiments, the IR up-conversion device further comprises an anode, a cathode, and/or a substrate. One of ordinary skill in the art would be able to identify appropriate materials for each layer based on the above disclosure. Additionally, it is noted that while FIG. 3 shows IR solar cell 300 having a standard architecture, the IR solar cell may instead have an inverted architecture in which the cathode is positioned adjacent the substrate.

In some embodiments, the IR solar cells described herein have properties that have been recognized as being advantageous. For example, the monodisperse, IR-absorbing nanoparticle layers may enhance charge extraction. Accordingly, the IR solar cells described herein may exhibit relatively high photocurrent efficiency (PCE). PCE generally refers to the ratio of the number of generated charge carriers to the number of absorbed photons. In some embodiments, the IR solar cell has a photocurrent efficiency of at least about 1%, at least about 2%, at least about 3%, at least about 4%, at least about 5%, at least about 6%, at least about 7%, at least about 8%, at least about 9%, at least about 10%, at least about 15%, or at least about 20% at a wavelength of at least about 700 nm, at least about 1000 nm, at least about 1200 nm, at least about 1500 nm, at least about 1800 nm, at least about 2000 nm, at least about 2500 nm, or at least about 3000.

In some embodiments, a solar panel comprises a plurality of IR solar cells, where at least a portion of the IR solar cells comprise a monodisperse, IR-absorbing nanoparticle layer. In certain embodiments, the solar panel comprises at least one IR solar cell capable of absorbing IR radiation at a first wavelength and at least one IR solar cell capable of absorbing IR radiation at a second, different wavelength. The solar panel may comprise at least 2, at least 3, at least 4, at least 5, at least 10, at least 20, at least 50, or at least 100 IR solar cells.

In some cases, the devices described herein may be relatively thin. For example, in certain embodiments, a device may have a thickness of about 1 μm or less, about 500 nm or less, about 200 nm or less, about 100 nm or less, about 50 nm or less, or about 10 nm or less. In some cases, the device may have a thickness in the range of about 10 nm to about 50 nm, about 10 nm to about 100 nm, about 10 nm to about 200 nm, about 10 nm to about 500 nm, about 10 nm to about 1 μm, about 50 nm to about 100 nm, about 50 nm to about 200 nm, about 50 nm to about 500 nm, about 50 nm to about 1 μm, about 100 nm to about 200 nm, about 100 nm to about 500 nm, about 100 nm to about 1 μm, or about 500 nm to about 1 μm.

Example 1

This example describes the fabrication and characterization of monodisperse PbS nanocrystals (NCs).

Highly monodisperse PbS nanocrystals (NCs) with absorption peaks of more than 2000 nm were synthesized by a multiple injection method. In order to synthesize monodisperse NCs, nucleation was suppressed during the growth process by controlling the molar ratio of precursors during the multiple injections. Compared with prior art methods, NCs were synthesized at a lower growth temperature (105° C.) within a shorter growth time (30 minutes).

Figure 4:
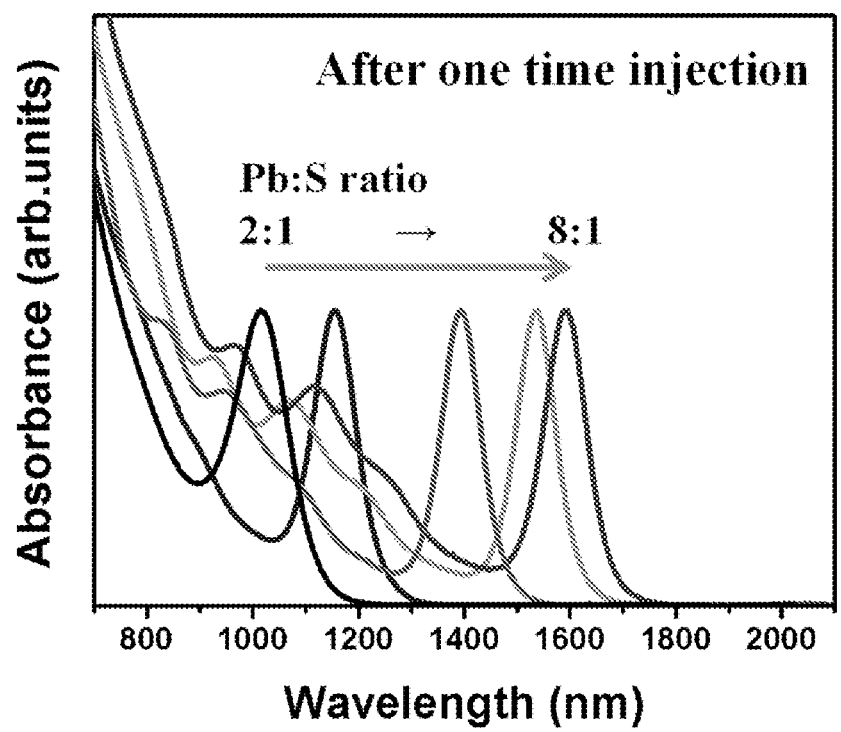
FIG. 4 shows absorption spectra of PbS nanocrystals formed after an initial injection having a molar Pb:S ratio ranging from 2:1 to 8:1, according to some embodiments.

Initially, the effect of the molar ratio of precursors during the initial injection was investigated. As shown in FIG. 4, the lead to sulfur (Pb:S) ratio was varied from 2:1 to 8:1, and absorption spectra were obtained. It was found that increasing the ratio of lead to sulfur resulted in a peak shift towards larger wavelengths. For example, it was found that at a Pb:S ratio of 2:1, a peak occurred at about 1000 nm, while at a Pb:S ratio of 8:1, a peak occurred at about 1600 nm. This therefore demonstrated that increasing the proportion of Pb relative to S resulted in highly monodisperse NCs capable of absorbing radiation at wavelengths above 1000 nm. Without wishing to be bound by a particular theory, this may have occurred due to the ratio of precursors in the initial injection controlling the number of initial nuclei that were formed. If most of the sulfur monomers in the precursor solution were consumed during the initial nucleation period, there were insufficient sulfur precursor monomers to initiate further growth. Instead, nucleation stopped, and uniform growth of existing nuclei began, resulting in larger NCs that absorbed radiation having longer wavelengths.

Figure 5A:
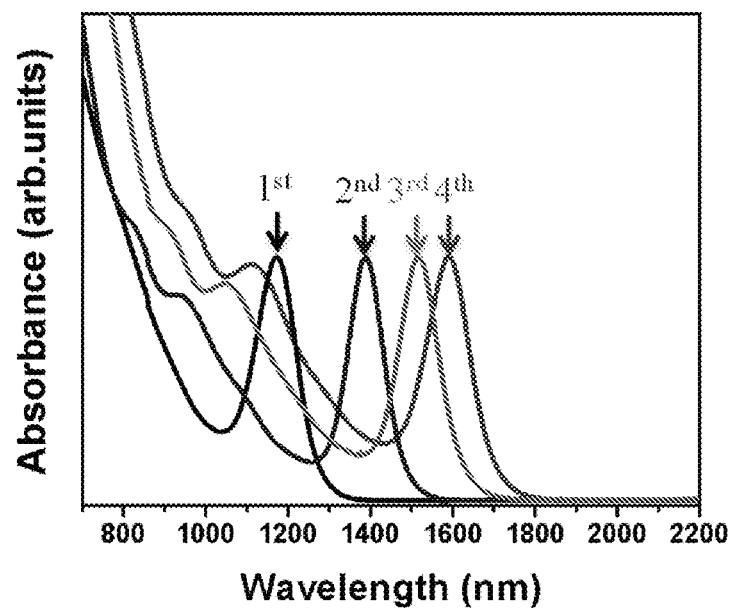
FIG. 5A shows, according to some embodiments, absorption spectra of PbS nanocrystals after one, two, three, and four injections.
Figure 5B:
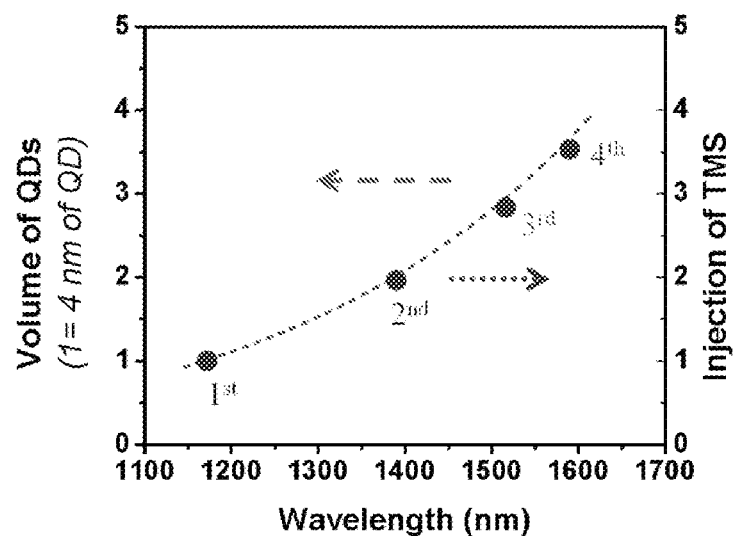
FIG. 5B shows, according to some embodiments, a plot of peak absorbed wavelength as a function of nanocrystal volume and number of bis(trimethylsilyl)sulfide [((CH$_3$)$_3$Si)$_2$S] (sometimes referred to as "TMS") injections.

It was recognized that the final size of the NCs was affected by the monomers remaining after initial nucleation. In order to extend the growth period and increase the final size of the NCs, a multiple injection method was developed. After the first injection described above, additional monomers were injected such that the sulfur concentration remained below the threshold concentration for nucleation. As a result, the additional sulfur monomers were only used to grow existing NCs without further nucleation, and PbS NCs with diameters larger than 10 nm were grown. FIG. 5A shows absorption spectra of PbS NCs after one injection, two injections, three injections, and four injections. From FIG. 5A, it can be seen that after the first injection, a peak occurred at about 1200 nm, after the second injection, a peak occurred at about 1400 nm, after the third injection, a peak occurred at about 1500 nm, and after the fourth injection, a peak occurred at about 1600 nm. This demonstrated that further injections increased the size of PbS NCs, leading to absorption of radiation having larger wavelengths. This can be further seen from FIG. 5B, which demonstrated that increasing numbers of bis(trimethylsilyl)sulfide ("TMS") injections, and concomitantly increasing the volume of quantum dots, resulted in absorption of radiation at increasing wavelengths. The optical absorption spectra in FIG. 5A also demonstrated the monodispersity of the PbS NCs.

Figure 6A:
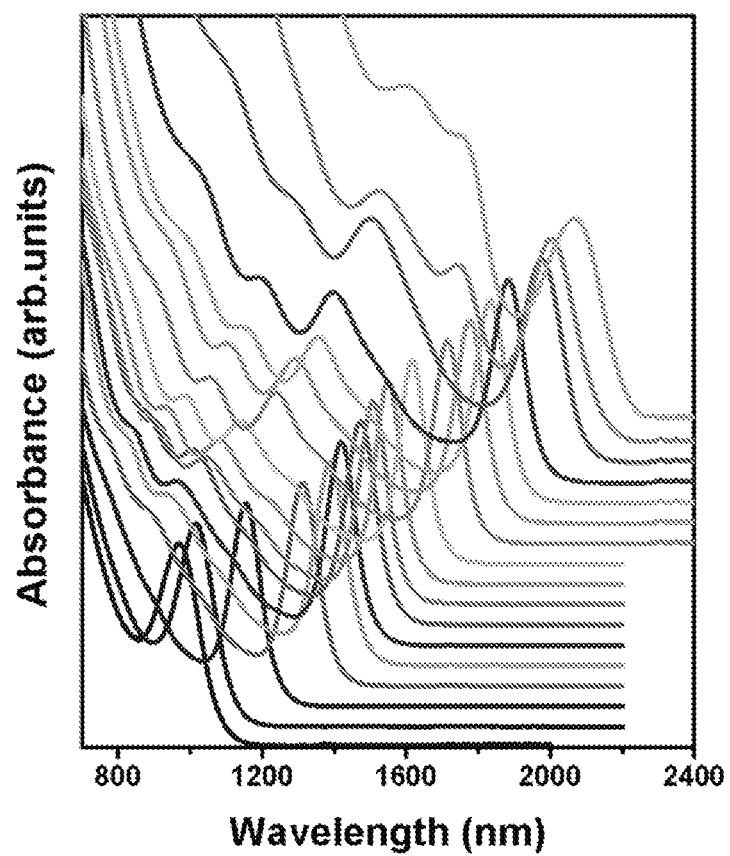
FIG. 6A shows, according to some embodiments, absorption spectra of PbS nanocrystals of different sizes in tetrachloroethylene.
Figure 6B:
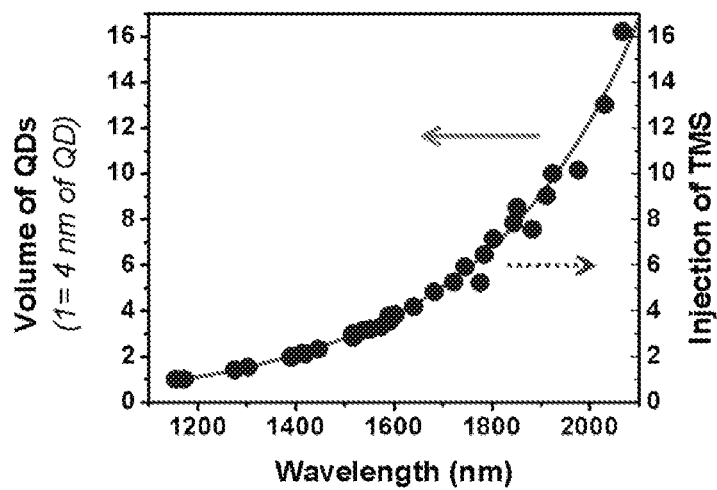
FIG. 6B shows, according to some embodiments, a plot of peak absorbed wavelength as a function of nanocrystal volume and number of bis(trimethylsilyl)sulfide ("TMS") injections.

With good control of initial nucleation and growth, large PbS NCs with an absorption peak of more than 2000 nm were grown. FIG. 6A shows absorption spectra of different sized PbS NCs in tetrachloroethylene (TCE). As demonstrated by FIG. 6A, PbS NCs synthesized by a multiple injection method were tuned from about 1.36 eV (913 nm) to about 0.59 eV (2085 nm). It was observed that the size distribution of NCs synthesized at low temperatures was much narrower than the size distribution of NCs synthesized at high temperatures. FIG. 6B also demonstrated that as the number of bis(trimethylsilyl)sulfide ("TMS") injections increased, and the volume of quantum dots accordingly increased, the radiation absorbed had longer wavelengths.

Figure 7:
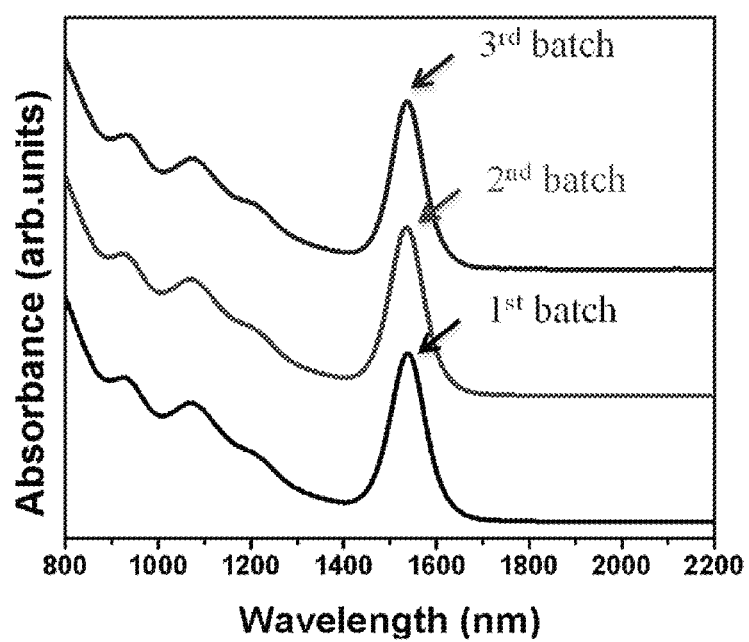
FIG. 7 shows absorption spectra of PbS nanocrystals synthesized in three different batches, according to some embodiments.

The reproducibility of synthesis of PbS NCs using the method described in this example was demonstrated. FIG. 7 shows plots of absorption spectra for PbS NCs synthesized in three different batches. It was found that the absorption spectra all exhibited a peak in the same location. This demonstrated that synthesis of NCs was highly reproducible and that the NCs were suitable for device applications.

Figure 8A:
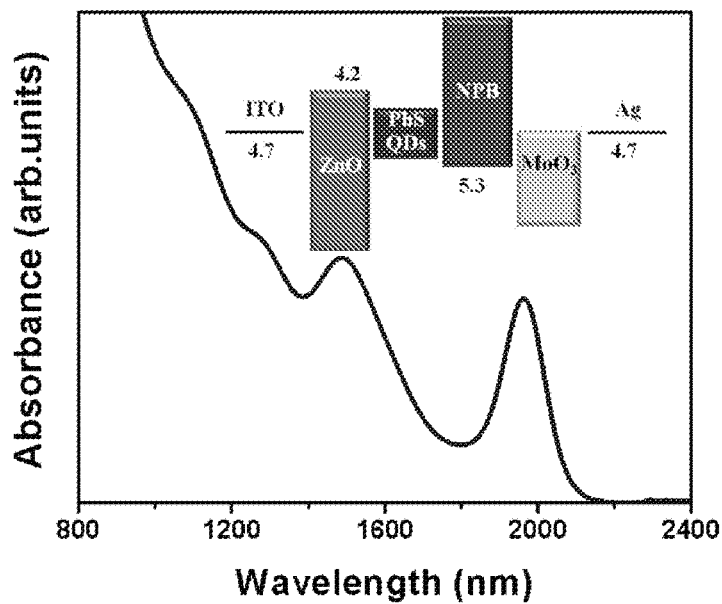
FIG. 8A shows, according to some embodiments, an absorption spectrum of PbS nanocrystals having a peak absorption of 1950 nm.
Figure 8B:
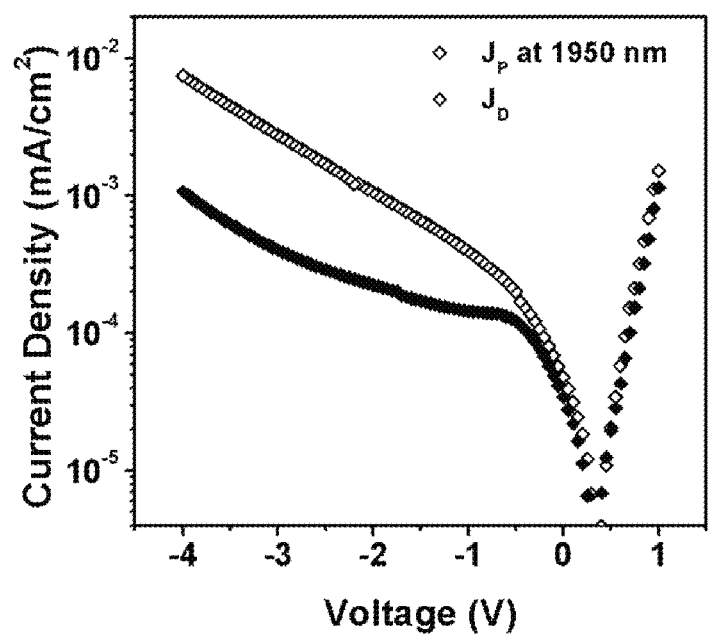
FIG. 8B shows, according to some embodiments, a plot of current density (mA/cm$^2$) as a function of voltage (V) for an IR photodetector comprising monodisperse, IR-absorbing nanoparticles in the dark and under IR illumination at 1950 nm.

A photodetector was fabricated with the monodisperse PbS NCs synthesized according to the multiple injection method. The photodetector comprised an ITO electrode, a ZnO hole blocking layer, a layer of PbS quantum dots, a hole transport layer comprising NPB, and a $MoO_3$ layer. It was found that the photodetector had an IR response of more than 2000 nm. FIG. 8A shows the absorbance spectrum of the PbS NCs used in the photodetector. A schematic of the energy band structure of the photodetector is shown in the inset of FIG. 8A. A photoresponse under IR illumination at 1800 nm was demonstrated, and the external quantum efficiency at 1800 nm was found to be 6.5%. The detectivity at 1800 nm was found to be $1 \times 10^{11}$ Jones. A photoresponse under IR illumination at 1950 nm was also clearly demonstrated. FIG. 8B shows the current-voltage (I-V) characteristics of the photodetector in the dark and under IR illumination at a peak absorption wavelength of 1950 nm.

Example 2

This Example describes the synthesis of large, monodisperse PbS NCs and the use of the NCs in a multi-spectral photodetector.

Visible and infrared (IR) photodetectors are widely used in optical communications, imaging, security, ranging, and consumer electronics. While silicon (Si) photodetectors are excellent in the visible and near IR regions, they generally have low sensitivity beyond 1000 nm. For sensing in the short-wave IR (SWIR) wavelength region (up to 1700 nm), InGaAs photodetectors are typically used. However, InGaAs image sensors are expensive because of the epitaxial process used to grow these materials, and they can only be used in the NIR and SWIR spectral regions. It is desirable to have a multi-spectral sensor with good wavelength sensitivity from 350 nm to 2000 nm.

Figure 9:
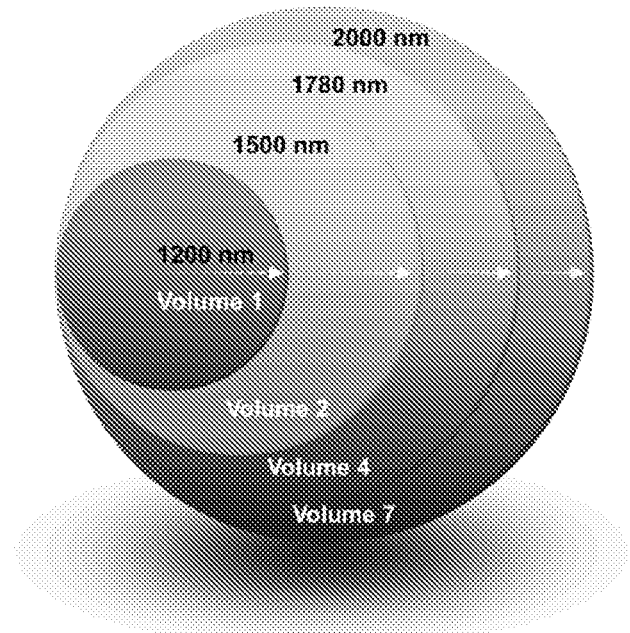
FIG. 9 shows a schematic diagram comparing the volumes of PbS nanocrystals with different absorption peaks, according to some embodiments.

PbS nanocrystals (NCs) with excellent photosensitivity, bandgap tunability, and solution processability provide an attractive platform for low-cost multi-spectral photodetectors with light sensitivity from the UV/Visible to SWIR (350-2000 nm) spectral regions. However, while there have been numerous reports of devices using PbS NCs as the IR sensitizing layer, most PbS NC devices have limited IR sensitivity beyond 1300 nm because of the challenges associated with synthesis of large PbS NCs. For example, PbS NCs with an absorption peak at 2000 nm have a volume 7 times the volume of NCs with an absorption peak at 1200 nm, as shown in FIG. 9, thus requiring a significant increase in the growth volume of the NCs. To synthesize large-size NCs, high growth temperatures and long growth times are typically used, leading to a high defect density and a large particle size dispersion due to uncontrollable nucleation and Ostwald ripening during growth. For example, in one study, PbS NCs with a diameter greater than 9.6 nm and absorption peaks longer than 2000 nm were synthesized. However, these large NCs were synthesized with a growth time longer than 120 minutes at a high growth temperature higher than 160° C., which resulted in a size dispersion larger than 20%. Because of the energetics of highly dispersed PbS NCs, they lead to charge trapping and poor charge extraction in devices.

In this Example, solution-processed inorganic UV-Visible-SWIR photodetectors with light sensitivity from 350 nm to 2000 nm were fabricated using highly monodisperse (less than about 4%) PbS NCs with an NC size larger than 8.2 nm, corresponding to an absorption peak of 1800 nm. The monodisperse NCs were synthesized by multiple injections of a sulfur precursor at a low growth temperature (100° C.) with a short growth time (less than 50 minutes). To achieve facile size control with high monodispersity, the growth process was separated from nucleation and was done by controlling the molar ratio of lead oxide (PbO) as the lead precursor and bis(trimethylsilyl)sulfide $[((CH_3)_3Si)_2S]$ (sometimes referred to as "TMS") as the sulfur precursor. Initial nucleation was controlled by the first injection of bis(trimethylsilyl)sulfide, and growth of the NCs was attained by subsequent multiple injections of bis(trimethylsilyl)sulfide. This method enabled PbS NC synthesis with excellent particle size control, resulting in well-defined absorption peaks at longer wavelengths and highly reproducible growth. Additionally, these NCs were very stable, and the resulting devices exhibited very good stability even without encapsulation.

Figure 10:
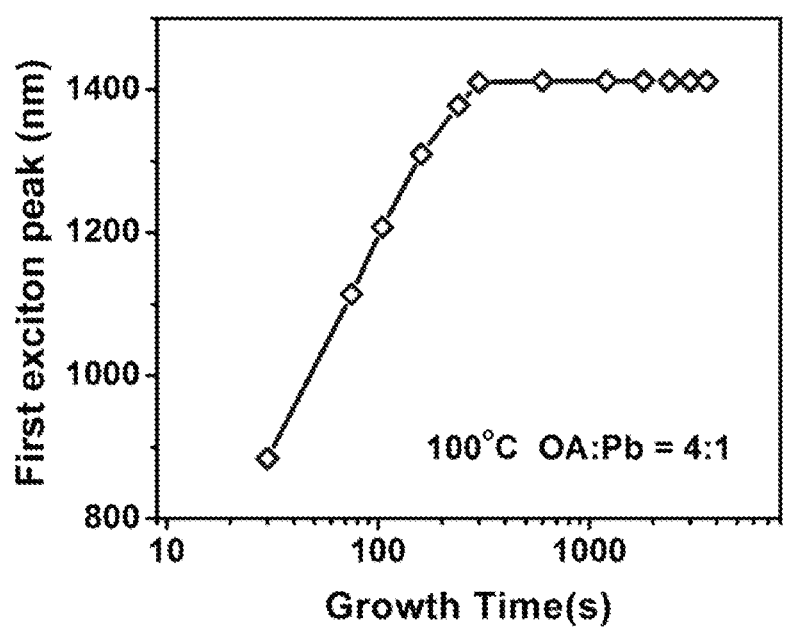
FIG. 10 shows, according to some embodiments, a plot of absorption peak (nm) as a function of growth time (s) after the first injection for PbS nanocrystals synthesized with an oleic to lead molar ratio of 4:1.

A typical hot injection method was modified for the PbS NC synthesis, in which the sulfur precursor solution [bis(trimethylsilyl)sulfide dissolved in octadecene] was rapidly injected into the lead precursor solution (PbO dissolved in a mixture of octadecene and oleic acid) under constant Ar flow with vigorous stirring. In previous hot injection PbS NC syntheses, nucleation and growth processes could not be separated, and growth of larger NCs required Ostwald ripening, resulting in a large size dispersion. To separate the growth process from nucleation, a multiple injection method for PbS NCs was developed. After the first injection of sulfur monomers for nucleation, additional injections supplied sufficient monomers for the growth of PbS NCs with diameters larger than 9.6 nm. In order to avoid large particle size distribution during the additional injection cycles, the lead precursors were diluted in non-coordinating solvents such as oleic acid (OA) and octadecene (ODE), such that there was no Ostwald ripening during the synthesis of NCs. This resulted in suppression of particle coarsening and particle size dispersion. As shown in FIG. 10, with this strategy, the initial growth was well controlled, and the seed NCs grown during the first injection with reaction times from 6 min to 60 min had identical absorption peaks.

Figure 11:
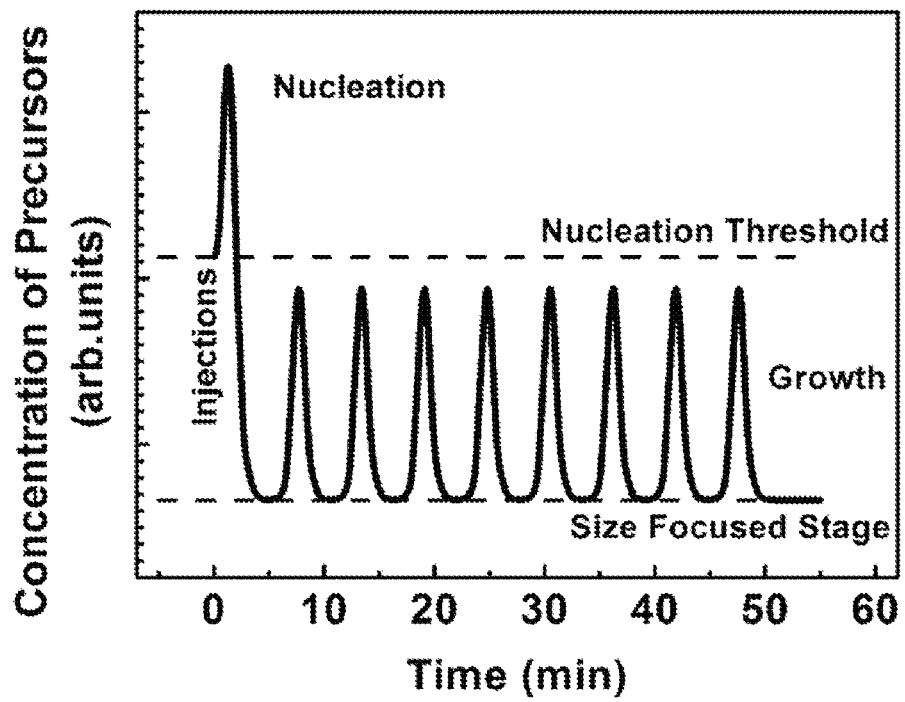
FIG. 11 shows a schematic illustration of the stages of nucleation and growth in the multiple injection NC synthesis method, according to some embodiments.
Figure 12:
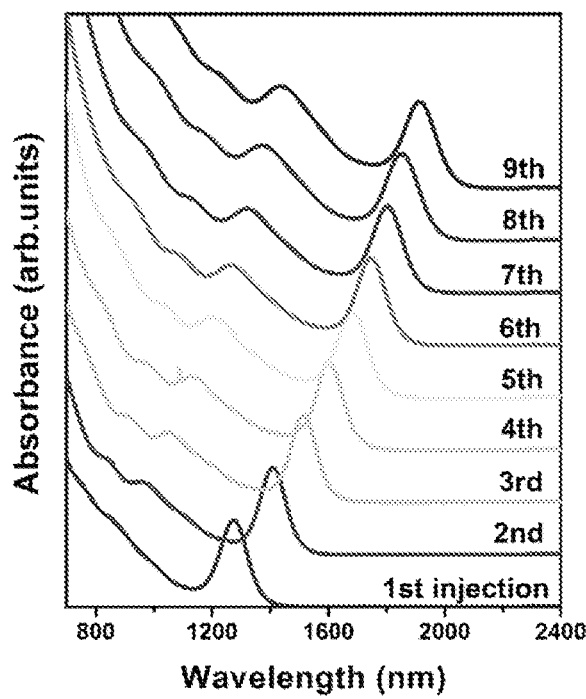
FIG. 12 shows, according to some embodiments, absorption spectra of PbS nanocrystals after 1-9 bis(trimethylsilyl) sulfide injections.
Figure 13:
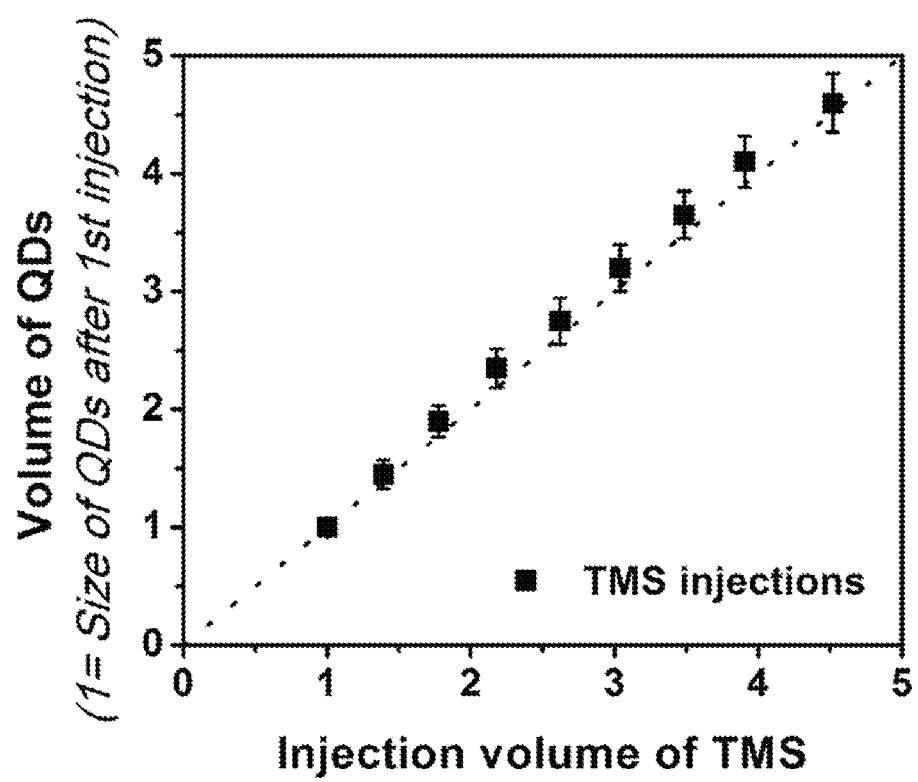
FIG. 13 shows a plot of NC volume (normalized to the NC volume after the 1$^{st}$ injection) as a function of bis(trimethylsilyl)sulfide ("TMS") injection volume, according to some embodiments.

To grow the NCs (i.e., increase their size), a multiple injection method of the bis(trimethylsilyl)sulfide solution was implemented as shown in FIG. 11. Nucleation began when the sulfur precursor concentration exceeded the nucleation threshold and stopped as the concentration was depleted below the threshold. The strategy that was adopted was to control the sulfur concentration below the nucleation threshold during subsequent injections such that the additional sulfur precursor only contributed to the growth of the NCs without further nucleation. Thus, the final NC size was determined by the amount of sulfur precursor added during subsequent injections. Using this method, highly monodisperse NCs with a diameter larger than 9 nm were consistently grown. FIG. 12 shows the absorption spectra of PbS NCs synthesized with 1-9 bis(trimethylsilyl)sulfide injections and demonstrates very well-controlled NC size. To demonstrate that all subsequent bis(trimethylsilyl)sulfide injections after the first bis(trimethylsilyl)sulfide injection only contributed to NC growth, FIG. 13 shows the dependence of the volumes of the synthesized NCs on the volumes of the injected sulfur precursor. In FIG. 13, the volume of the synthesized NCs is proportional to the volume of additional injected sulfur precursor with a slope of 1, indicating that additional sulfur precursor injections were consumed for growth only.

Figure 14:
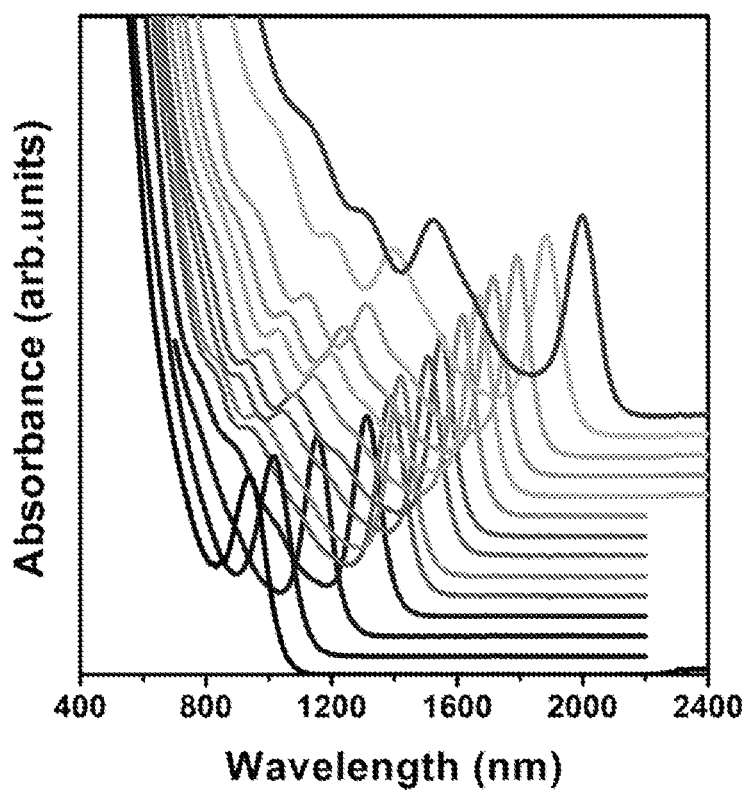
FIG. 14 shows, according to some embodiments, absorption spectra of different-sized PbS NCs in tetrachloroethylene (TCE)
Figure 15:
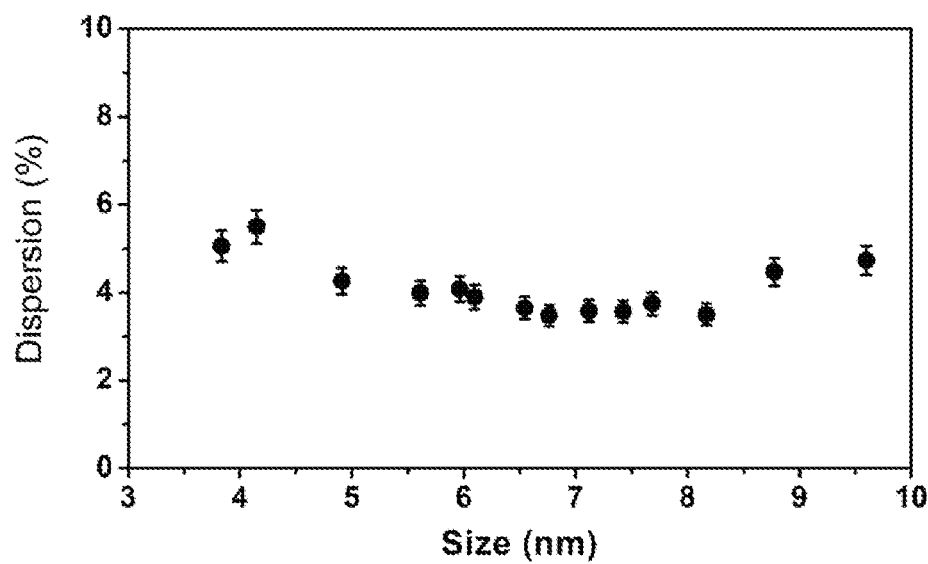
FIG. 15 shows a plot of dispersion (%) as a function of PbS NC size (nm), according to some embodiments.

With this good control of nucleation and growth, large PbS NCs with an absorption peak at 2000 nm were synthesized. FIG. 14 shows the absorption spectra of PbS NCs with different sizes from 3.9 nm to 9.6 nm, corresponding to absorption peak wavelengths from 920 nm to 2000 nm, respectively. The multiple injection method resulted in highly monodisperse size distributions, even with a particle size larger than 9.6 nm. As shown in FIG. 15, there was no increase in size dispersion with increasing NC size, and the NC size dispersion values were below 6%. The reproducibility of the PbS NC synthesis using the multiple injection method was also confirmed. Three separate PbS NCs syntheses gave the same NC size and dispersion, showing that the batch-to-batch variation was very small. This excellent reproducibility demonstrated the suitability of these NCs for device fabrication.

Figure 16:
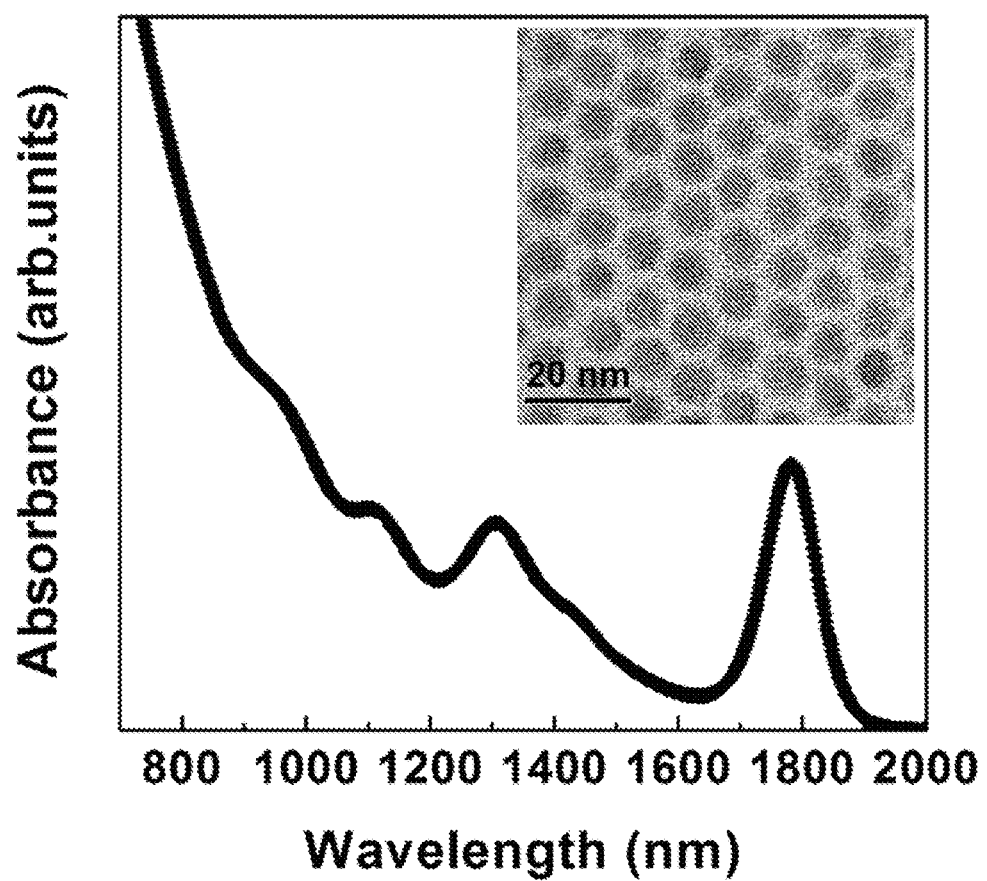
FIG. 16 shows, according to some embodiments, an absorption spectrum of PbS NCs with a peak absorption of 1800 nm, along with an inset TEM image of the PbS NCs.
Figure 17:
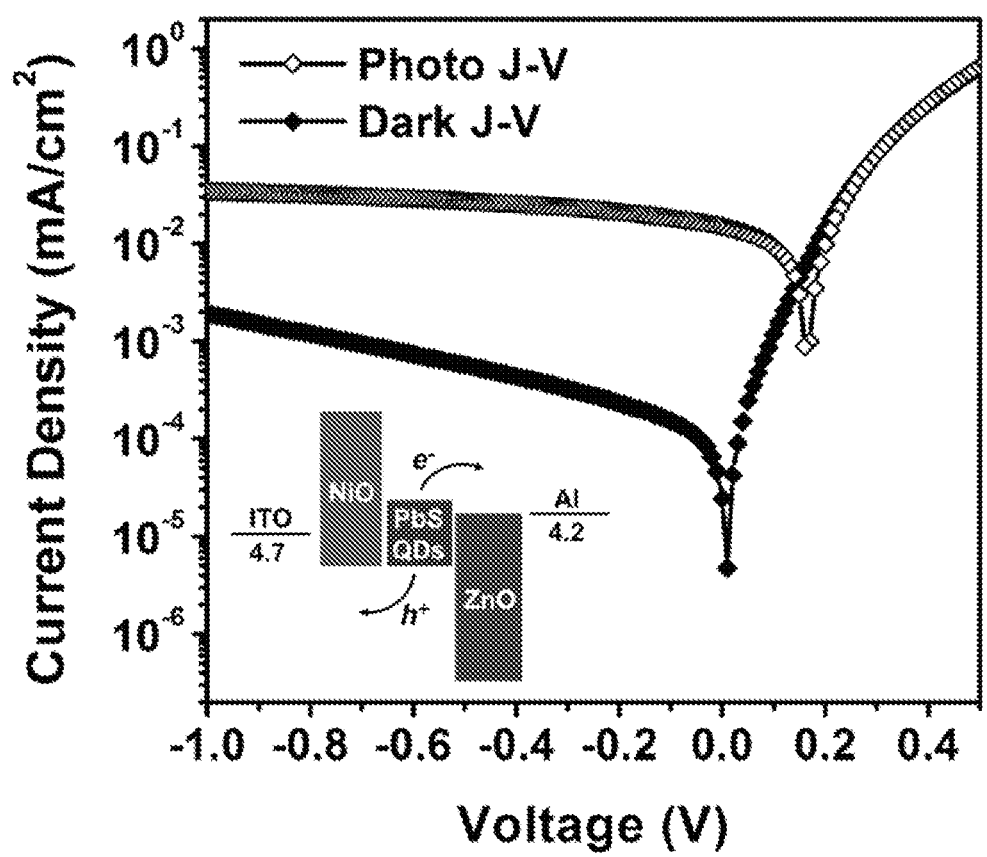
FIG. 17 shows a plot of current density (mA/cm$^2$) as a function of voltage (V) in the dark and under IR illumination at 1800 nm, along with an inset energy band diagram of a PbS photodetector, according to some embodiments.

A multi-spectral photodetector was fabricated using the highly monodisperse NCs synthesized via the multiple injection method, with a layer of the highly monodisperse NCs sandwiched between colloidal ZnO nanoparticles as the electron transport/hole blocking layer (ETL/HBL) and solution-derived NiO as the hole transport/electron blocking layer (HTL/EBL). This formed a P-I-N-like photodiode structure with a low dark current, despite the narrow bandgap of the PbS NC photoactive layer. FIG. 16 shows the absorption spectrum of the PbS NCs used in the photodetector, and the inset of FIG. 16 shows a transmission electron microscopy (TEM) image of the NCs that confirms that the PbS NCs were highly monodisperse. FIG. 17 shows the current-voltage (J-V) characteristics of the photodiode in the dark and under IR illumination at $\lambda=1800$ nm with a power density of 140 $\mu W/cm^2$. The schematic energy band diagram of the photodetector is shown in the inset of FIG. 17.

Figure 18:
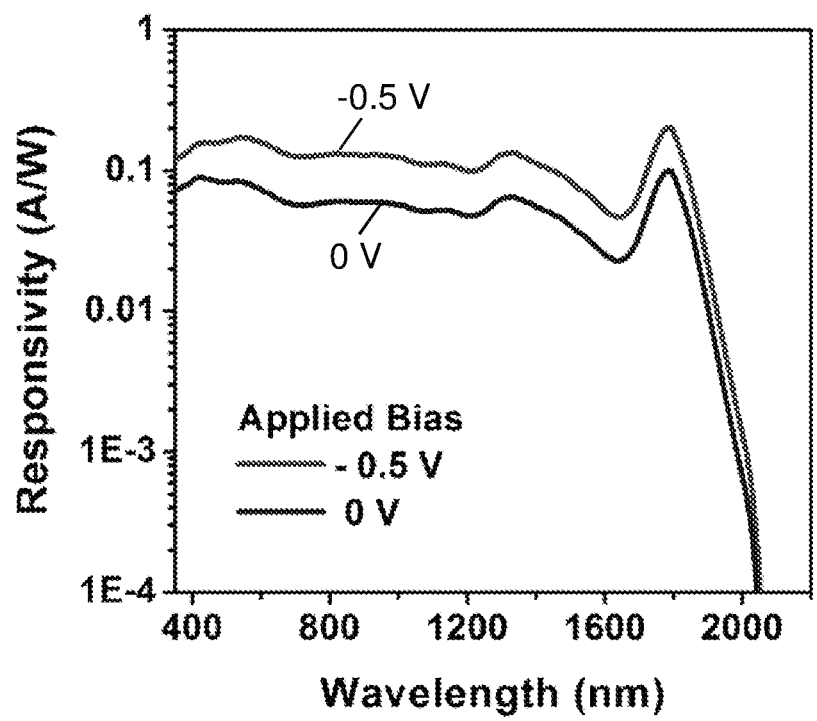
FIG. 18 shows, according to some embodiments, responsivity values (A/W) as a function of wavelength (nm) for the PbS photodetector at −0.5 V and at 0 V.
Figure 19:
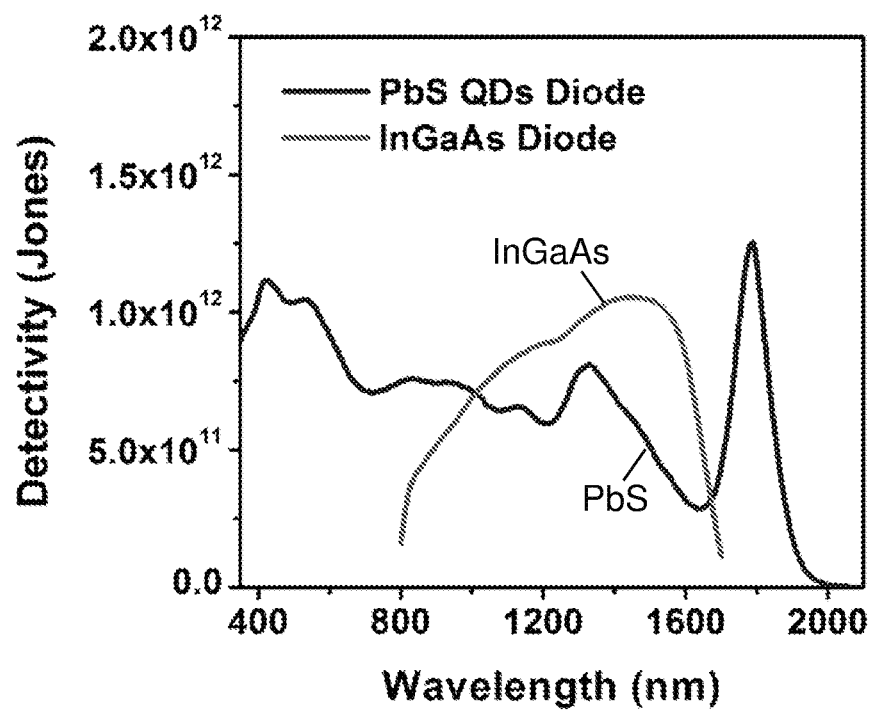
FIG. 19 shows detectivity values (Jones) as a function of wavelength (nm) for the PbS photodetector and an InGaAs diode, according to some embodiments.

The photodetector exhibited typical rectifying characteristics of a diode, with a rectification ratio of about $1 \times 10^3$ ($\pm 0.5$ V). The photodiode showed low dark currents of $4 \times 10^{-6}$ mA/cm$^2$ at 0 V and $2 \times 10^{-3}$ mA/cm$^2$ at $-1$ V. FIG. 18 shows the responsivity spectra at 0 V and $-0.5$ V. The responsivity spectra were similar to the absorption spectra of the PbS NCs, showing a peak wavelength of 1800 nm. The responsivity values at a reverse bias of $-0.5$ V were in the range of 0.05-0.21 A/W, corresponding to external quantum efficiencies of 1-50%, over the entire wavelength range of 350 nm to 2000 nm. At the absorption maximum of 1800, responsivity reached a value of 0.21 A/W. These responsivity values were on the same order of magnitude as the values reported for commercially available photodiodes. The figure of merit for a photodetector is the specific detectivity (D*), which can be determined according to Equation 4:

$$D^* = (A\Delta f)^{1/2} R/i_n \qquad (4)$$

where A is the area of the detector in cm$^2$, $\Delta f$ is the bandwidth in Hz, R is the corresponding responsivity in A/W, and $i_n$ is the noise current in A. Using the measured values of noise current and responsivity, detectivity spectra of the multi-spectral photodetector with large PbS NCs were obtained. The detectivity spectra of the PbS NC device (and an InGaAs device for comparison) are shown in FIG. 19. The detectivity spectrum of the PbS NC device was similar to the absorption spectrum of the PbS NC device, showing a peak wavelength of 1800 nm. The detectivity values of the PbS NC device were over 1×10$^{11}$ Jones for UV-Visible-SWIR wavelengths from 350 nm to 2000 nm, and the maximum detectivity value was 1.2×10$^{12}$ Jones at the peak wavelength of 1800 nm, despite the narrow bandgap of the large PbS NCs.

Figure 20:
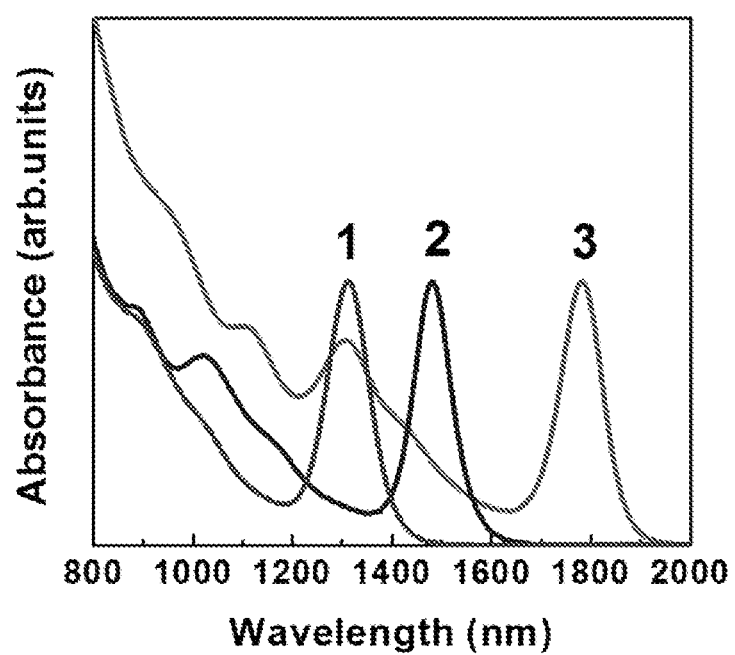
FIG. 20 shows, according to some embodiments, absorption spectra for three different sized PbS NCs.
Figure 21A:
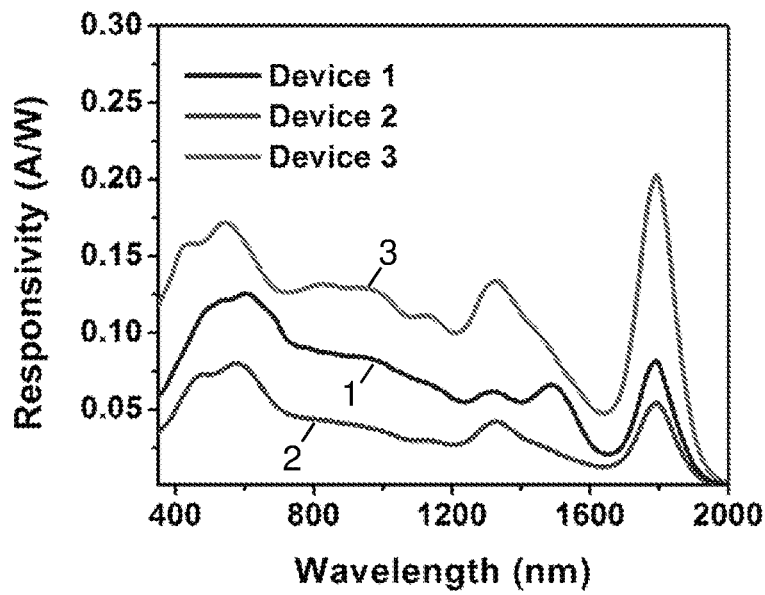
FIG. 21A shows responsivity values (A/W) as a function of wavelength (nm) for 3 photodetectors comprising mixtures of different-sized PbS NCs (Devices 1 & 2) or monodisperse PbS NCs (Device 3), according to some embodiments.
Figure 21B:
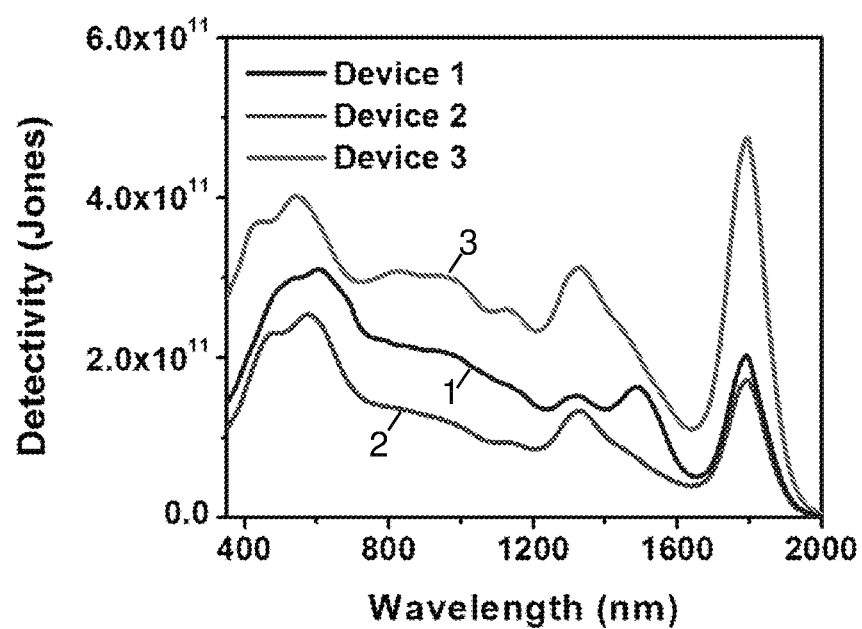
FIG. 21B shows detectivity values (Jones) as a function of wavelength (nm) for Devices 1, 2, and 3, according to some embodiments.

To further study the effects of NC dispersity on device performance, the following photodetectors were fabricated using different mixtures of PbS NCs: Device 1 comprised a mixture of PbS NCs with absorption peaks of 1470 nm and 1800 nm, and Device 2 comprised a mixture of PbS NCs with absorption peaks of 1320 nm and 1800 nm. Device 3, which was made with monodisperse NCs with an absorption peak at 1800 nm, was used as a reference. The absorption spectra of the different-sized PbS NCs are shown in FIG. 20. In FIG. 21A, the responsivity spectra of Devices 1, 2, and 3 at a reverse bias of −0.5 V are shown, and in FIG. 21B, the detectivity spectra of Devices 1, 2, and 3 at a reverse bias of −0.5 V are shown. In the responsivity and detectivity spectra for Devices 1 and 2, there were two absorption peaks that corresponded to a mixture of two different sized PbS NCs. The responsivity values of Devices 1 and 2 at the peak wavelength of 1800 nm were 40% and 27%, respectively, of the corresponding value for the reference device (Device 3), indicating that the photo-generated charge carrier extraction in the devices with mixed NCs was suppressed due to the polydispersity of the NCs. As a result, the detectivity values of Devices 1 and 2 at the peak wavelength of 1800 nm were 43% and 36%, respectively, of the corresponding value for Device 3. Furthermore, Device 2 showed a lower responsivity and detectivity than Device 1, indicating that a larger dispersity resulted in stronger charge trapping in the PbS NC layer. Therefore, the data showed the importance of monodispersity of NCs for optimum device performance.

Figure 22:
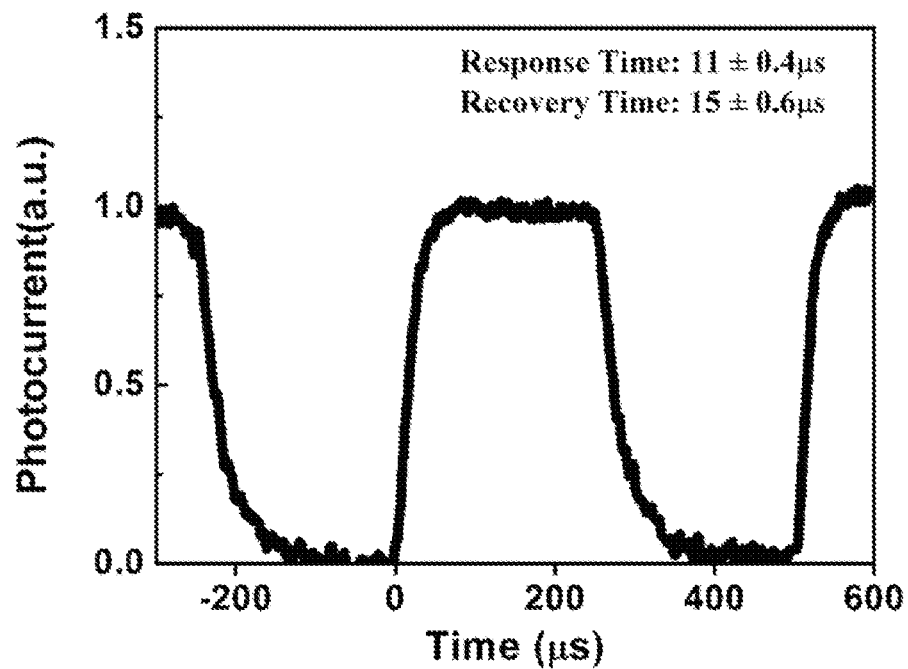
FIG. 22 shows, according to some embodiments, a plot of photocurrent as a function of time (μs) for the PbS photodetector.
Figure 23:
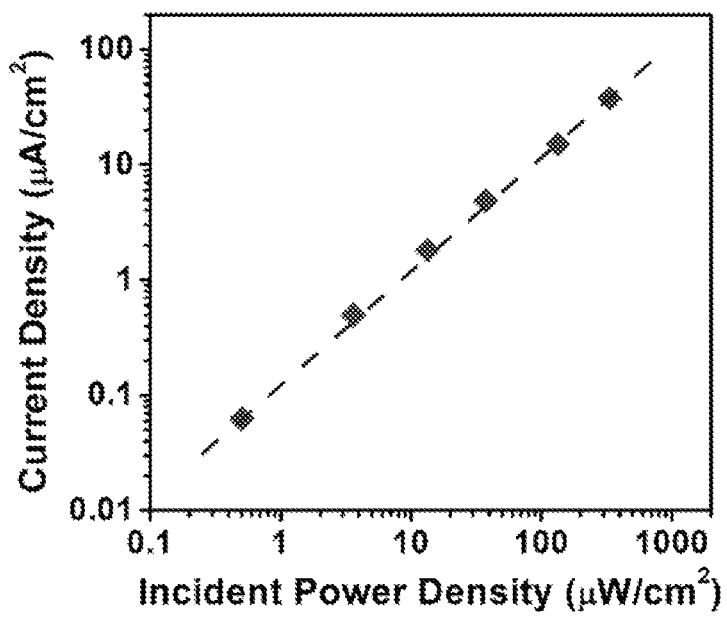
FIG. 23 shows the linear dynamic range of the PbS photodetector measured at −1 V, according to some embodiments.

To characterize the temporal response of the photodetector, the device speed of response was measured using a pulsed light emitting diode (LED) light source. A rise time of 11.0±0.4 µs and a fall (recovery) time of 15.0±0.6 µs were obtained, as shown in FIG. 22. The corresponding bandwidth was over 10 kHz, which is sufficient for imaging applications. FIG. 23 shows the linearity of the photoresponse over 3 decades of power intensity.

Figure 24:
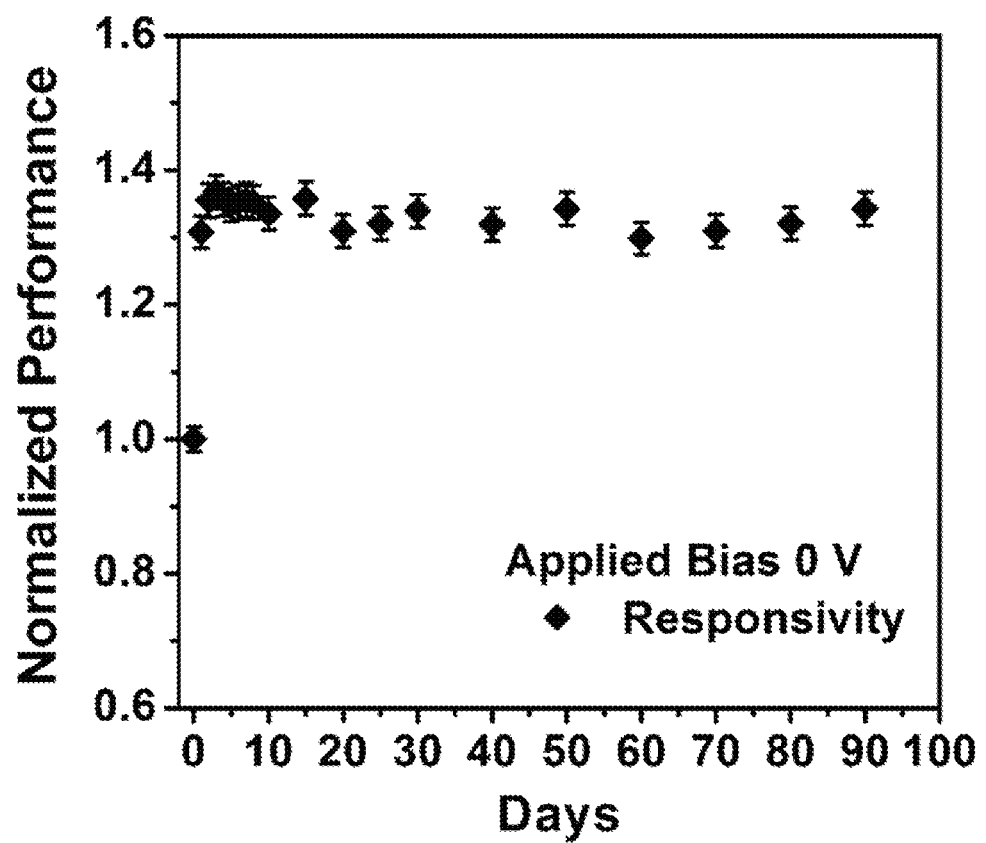
FIG. 24 shows, according to some embodiments, normalized performance of the PbS photodetector through three months of storage in air in ambient lab conditions without encapsulation.

The storage stability of the photodetector was also measured, as shown in FIG. 24. During the testing period of 3 months, the unencapsulated device was stored in an ambient environment. In the first few days of storage, the device performance actually improved slightly, and subsequently the device remained stable during the entire testing period. The initial improvement in device performance has also been reported with solution-processed oxide with charge blocking layers including ZnO and NiO. The air stability data suggest that these solution-processed UV-Visible-SWIR PbS NC-based photodetectors are very stable.

In conclusion, solution-processed inorganic UV-Visible-SWIR photodetectors with light sensitivity from 350 nm to 2000 nm were fabricated using highly monodisperse large PbS NCs with extremely low size dispersions (less than 6%). These highly monodisperse large PbS NCs were synthesized by multiple injections of the sulfur precursor solution to grow the NCs without initiating new nucleation during growth. This method enabled PbS NC synthesis with excellent particle size control, resulting in well-defined absorption peaks at long wavelengths. The UV-Visible-SWIR multi-spectral photodetector fabricated from these highly monodisperse large PbS NCs showed detectivity values of over 1×10$^{11}$ Jones from 350 nm to 2000 nm, and a maximum detectivity value of 1.2×10$^{12}$ Jones at the peak wavelength of 1800 nm. With a speed of response on the order of a few tens of microseconds, the bandwidth was about 10 kHz and was sufficient for imaging applications. Additionally, these NCs were very stable, and the lifetime of the devices made with these NCs showed extremely good stability.

Experimental Section

Synthesis of PbS Nanocrystals:

In a typical reaction, PbO (0.446 g) was dissolved in a mixture of octadecene (50 ml) and oleic acid (3.8 ml) under a constant flow of argon with vigorous stirring. The mixture was heated to 100° C. for about 1 hour to dry the solution and form lead oleate. A solution of bis(trimethylsilyl)sulfide [((CH$_3$)$_3$Si)$_2$S] was dissolved in octadecene in the range of 0.5 mmol to 2 mmol. The solution of bis(trimethylsilyl)sulfide was rapidly injected into the lead oleate solution at 100° C. The addition of bis(trimethylsilyl)sulfide raised the concentration of molecularly dissolved sulfur above the nucleation threshold. The rate of nucleation was controlled by the concentration of sulfur and surfactant (oleic acid). After the nucleation stage, the concentration of sulfur decreased below the critical concentration, and nucleation fell almost immediately to zero. In order to extend the growth period and then increase the final size of nanocrystals, a multiple injection method was developed. After the initial injection of bis(trimethylsilyl)sulfide for nucleation, additional injections of bis(trimethylsilyl)sulfide in the range of 0.1 mmol to 0.4 mmol supplied sufficient precursor for the growth of PbS NCs with diameters larger than 9.6 nm. To terminate the reaction, cold toluene was injected into the reaction mixture. The synthesized nanocrystals were subsequently washed via precipitation with a polar solvent, such as isopropanol, acetone, or methanol, and redispersed in toluene. The washing process was repeated three times to eliminate excess unreacted precursors and reaction byproducts.

Synthesis of ZnO Nanoparticles:

The synthesis was performed by dropwise addition of a stoichiometric amount of tetramethylammonium hydroxide (TMAH) (0.55 M) to 30 mL of 0.1 M zinc acetate dihydrate dissolved in dimethyl sulfoxide (DMSO) under continuous stirring. After precipitation and washing, the nanoparticles were dispersed in pure ethanol.

Synthesis of NiO Precursors:

A 0.1 M solution of nickel acetate tetrahydrate in ethanol was prepared. A 1:1: mole ratio of monoethanolamine (MEA) to nickel was added as a complexing agent, and the solution was stirred until all reagents dissolved into a green solution.

Device Fabrication:

The NiO precursor solution was spincast onto solvent and UVO$_3$-cleaned ITO-coated glass substrates and heated to 500° C. in air for one hour to form continuous NiO films. After cooling, the substrates were spincast from a dilute suspension of QDs in chloroform. After each layer deposition, the films were soaked in a 1.0 M solution of 1,3-benzenedithiol in acetonitrile for the ligand exchange. This PbS film deposition and ligand exchange procedure was repeated to yield approximately 200 nm thick films. ZnO nanoparticles were directly spincast on top, and the device was heated to 80° C. for 15 minutes. Then a 100 nm thick aluminum cathode was thermally evaporated at chamber pressures of about $10^{-6}$ Torr. All layers were spincast in air.

Device Characterization:

All characterization and noise measurements were performed at room temperature. Current-voltage (J-V) characterization was performed with a Keithley 4200 semiconductor parameter analyzer system. EQE and responsivity measurements were conducted using an in-house setup comprising a Xenon DC arc lamp, an ORIEL 74125 monochromator, a Keithley 428 current amplifier, an SR 540 chopper system, and an SR830 DSP lock-in amplifier from SRS. Spectrophotometry provided a direct measure of the NC optical and electronic properties, including the absorption spectra of the NCs, the particle size, and particle size distribution. From the absorption spectra of the nanocrystals, the energy band gap of the nanocrystals was approximated by calculating the energy of the absorbed photons at the first excitonic absorption peak of the NCs. The NC samples were usually diluted solutions in a solvent that did not have background absorption interfering with the NC material, such as tetrachloroethylene (TCE). As an alternative, the samples may also be prepared in thin film form coated on glass substrates. The size distribution of the nanocrystals was defined by FWHM of the absorption spectra of quantum dots. A smaller FWHM corresponded to a narrower nanocrystal size distribution. The FWHM values of the UV-vis spectra were measured according to the following steps. First, a line was drawn by linking the top point of the peak to the center of the baseline, then a line parallel to the baseline was made through the center of the resulting line. After that, there were two points of intersection between the line and the peak. The wavelength difference between the two points was the FWHM value of the absorption peak.

Transmission electron microscopy (TEM) was performed on field emission STEM (JEOL 2010F) operating at 200 kV. In order to determine average size and dispersion, TEM images were analyzed. TEM samples were prepared by dropping QDs solution in chloroform on the amorphous carbon film coated grids.

The noise current in the photodetector was measured using a Stanford Research SR830 lock-in amplifier and a SR570 low noise preamplifier. During the measurements, the lock-in frequency of the noise current was set to 30 Hz. In order to minimize the noise, the device was biased with alkaline batteries, and measurements were carried out in an electrically and optically shielded probe station.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention.

More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method of forming a plurality of nanocrystals comprising:
    adding a first amount of a first solution to a second solution to form a first mixed solution, wherein the first solution comprises a first element and the second solution comprises a second element, wherein the molar ratio of the first element to the second element in the first mixed solution is above a nucleation threshold;
    subsequent to adding the first amount of the first solution to the second solution, adding a second amount of the first solution to the first mixed solution to form a second mixed solution, wherein the molar ratio of the first element to the second element in the second mixed solution is below the nucleation threshold;
    subsequent to adding the second amount of the first solution, stirring the second mixed solution for a period of between 2 and 50 minutes;
    adding a third amount of the first solution to the second mixed solution to form a third mixed solution, wherein the molar ratio of the first element to the second element in the third mixed solution is below the nucleation threshold, wherein the molar ratio of the first element to the second element in the third mixed solution is in the range of about 1:20 to about 1:1,
    whereby a plurality of nanocrystals comprising the first element and the second element is formed, wherein the plurality of nanocrystals has a mean maximum cross-sectional dimension of about 2 nm or more with a relative standard deviation of about 10% or less, wherein the plurality of nanocrystals is capable of absorbing electromagnetic radiation having a wavelength of at least about 700 nm, and
    wherein the step of adding the first amount of the first solution to the second solution to form the first mixed solution is conducted at a temperature of about 180° C. or less.

2. A method of forming a plurality of nanocrystals, comprising:
    adding a first amount of a first solution to a second solution to form a first mixed solution, wherein the first solution comprises a first element and the second solution comprises a second element, wherein the molar ratio of the first element to the second element in the first mixed solution is above a nucleation threshold;
    subsequent to adding the first amount of the first solution to the second solution, adding a second amount of the first solution to the first mixed solution to form a second mixed solution, wherein the molar ratio of the first element to the second element in the second mixed solution is below the nucleation threshold;
    subsequent to adding the second amount of the first solution, stirring the second mixed solution for a period of between 2 and 50 minutes,
    whereby a plurality of nanocrystals comprising the first element and the second element is formed, wherein the plurality of nanocrystals has a mean maximum cross-sectional dimension of about 2 nm or more with a relative standard deviation of about 10% or less, wherein the plurality of nanocrystals is capable of absorbing electromagnetic radiation having a wavelength of at least about 700 nm,
    wherein the step of adding the first amount of the first solution to the second solution to form the first mixed solution is conducted at a temperature of about 180° C. or less.

3. The method of claim 2, wherein the first mixed solution has a molar ratio of the first element to the second element in the range of about 1:20 to about 1:1.

4. The method of claim 2, wherein the second mixed solution has a molar ratio of the first element to the second element in the range of about 1:20 to about 1:1.

5. The method of claim 2, wherein the plurality of nanocrystals is capable of absorbing electromagnetic radiation having a wavelength of at least about 2.5 microns.

6. The method of claim 2, wherein the first element is sulfur or selenium, and wherein the second element is lead or silver.

7. The method of claim 2, wherein the first solution comprises a first compound and a first solvent, the second solution comprises a second compound and a second solvent, and wherein the first solvent comprises trialkyl phosphine, n-alkyl amine, trialkyl amine, and/or octadecene.

8. The method of claim 7, wherein the first compound comprises bis(trimethylsilyl)sulfide, bis(trialkylsilyl)sulfide, elemental sulfur, dialkyl thiourea, thioacetamide, dimethylthioformamide, alkylthiol, alkyldisulfide, and/or hydrogen sulfide.

9. The method of claim 7, wherein the second compound comprises lead oxide, lead acetate, lead acetylacetonate, lead nitrate, lead chloride, lead iodide, lead bromide, lead sulfate, lead tantalite, lead titanate, and/or lead chromate.

10. The method of claim 2, wherein the first mixed solution and/or second mixed solution comprises a surfactant that comprises oleic acid, oleylamine, octylamine, octadecylamine, sodium dodecyl sulfate (SDS), polyvinyl pyrrolidone (PVP), glycerol, dioctyl sodium sulfosuccinate, cetyltrimethylammonium bromide, and/or diethyl sulfosuccinate.

11. The method of claim 2, further comprising adding a third solvent to the second mixed solution to isolate the plurality of nanocrystals, wherein the third solvent comprises small alkyl chain alcohols, ethyl acetate, dimethylformamide, acetonitrile, methanol, ethanol, propanol, toluene, chloroform, and/or acetone.

12. The method of claim 2, wherein the plurality of nanoparticles has nanocrystals have a mean maximum cross-sectional dimension of about 10 nm or more.

13. The method of claim 2, wherein the relative standard deviation is about 5% or less.

* * * * *

UNITED STATES PATENT AND TRADEMARK OFFICE
CERTIFICATE OF CORRECTION

PATENT NO. : 10,749,058 B2
APPLICATION NO. : 15/735303
DATED : August 18, 2020
INVENTOR(S) : Franky So et al.

Page 1 of 1

It is certified that error appears in the above-identified patent and that said Letters Patent is hereby corrected as shown below:

In the Claims

At Column 36, Line 65, Claim 12:
"wherein the plurality of nanoparticles has nanocrystals have a mean maximum cross-sectional dimension of about 10nm or more."

Should read:
--wherein the plurality of nanocrystals have a mean maximum cross-sectional dimension of about 10nm or more.--

Signed and Sealed this
Twenty-seventh Day of October, 2020

Andrei Iancu
*Director of the United States Patent and Trademark Office*